(12) United States Patent
Lu et al.

(10) Patent No.: US 9,575,108 B2
(45) Date of Patent: Feb. 21, 2017

(54) COMPLIANCE ASSESSMENT OF HUMAN EXPOSURE FROM WIRELESS ELECTRIC VEHICLE CHARGING SYSTEM USING AT LEAST ONE PHANTOM MODEL

(71) Applicant: QUALCOMM Incorporated, San Diego, CA (US)

(72) Inventors: Lin Lu, San Diego, CA (US); Jagadish Nadakuduti, La Jolla, CA (US); Paul Guckian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 112 days.

(21) Appl. No.: 14/574,095

(22) Filed: Dec. 17, 2014

(65) Prior Publication Data

US 2015/0177302 A1   Jun. 25, 2015

Related U.S. Application Data

(60) Provisional application No. 61/918,568, filed on Dec. 19, 2013.

(51) Int. Cl.
| | |
|---|---|
| *G08B 21/00* | (2006.01) |
| *G01R 29/08* | (2006.01) |
| *B60L 11/18* | (2006.01) |
| *B60L 3/12* | (2006.01) |

(52) U.S. Cl.
CPC ........... *G01R 29/0878* (2013.01); *B60L 3/12* (2013.01); *B60L 11/182* (2013.01); *B60L 11/1838* (2013.01); *G01R 29/0814* (2013.01); *G01R 29/0857* (2013.01); *B60L 2230/10* (2013.01); *B60L 2260/44* (2013.01); *B60L 2270/147* (2013.01); *Y02T 10/7005* (2013.01); *Y02T 10/7088* (2013.01); *Y02T 90/121* (2013.01); *Y02T 90/122* (2013.01); *Y02T 90/128* (2013.01); *Y02T 90/14* (2013.01); *Y02T 90/163* (2013.01)

(58) Field of Classification Search
CPC .................................................... G01R 29/0878
USPC ........................ 340/540, 573.1, 600; 307/104
See application file for complete search history.

(56) References Cited

U.S. PATENT DOCUMENTS

2012/0262002 A1   10/2012   Widmer et al.

OTHER PUBLICATIONS

Christ A., et al., "Assessing Human Exposure to Electromagnetic Fields From Wireless Power Transmission Systems", Proceedings of the IEEE, IEEE. New York, US, vol. 101, No. 6, Jun. 1, 2013 (Jun. 1, 2013), pp. 1482-1493, XP011510162.

(Continued)

*Primary Examiner* — Jeffery Hofsass
(74) *Attorney, Agent, or Firm* — Knobbe, Martens, Olson & Bear LLP

(57) ABSTRACT

This disclosure provides systems, methods and apparatus for assessing electromagnetic exposure. In one aspect an apparatus is provided. The apparatus includes at least a first circuit configured to calculate electromagnetic exposure of at least a portion of at least one human in proximity to a wireless electric vehicle charging system. The portion of the at least one human is modeled by at least one homogeneous phantom model having dielectric properties that are representative of human tissue. The apparatus further includes at least a second circuit configured to scale the calculated electromagnetic exposure to simulate an electromagnetic exposure based on an inhomogeneous anatomical model of the portion of the at least one human.

29 Claims, 16 Drawing Sheets

(56) References Cited

OTHER PUBLICATIONS

International Search Report and Written Opinion—PCT/US2014/071249—ISA/EPO—Mar. 27, 2015.
Jiang H., et al., "Safety considerations of wireless charger for electric vehicles a review paper", Product Compliance Engineering (ISPCE), 2012 IEEE Symposium on, IEEE, Nov. 5, 2012 (Nov. 5, 2012), pp. 1-6, XP032293971.
Laakso I., et al., "Evaluation of the induced electric field and compliance procedure for a wireless power transfer system in an electrical vehicle", Physics in Medicine and Biology, Institute of Physics Publishing, Bristol GB, vol. 58, No. 21, Oct. 10, 2013 (Oct. 10, 2013), pp. 7583-7593, XP020252309.
Christ a., et al., "The Virtual Family Development of Surface-Based Anatomical CAD Models of Two Adults and Two Children for Dosimetric Simulations", Physics in Medicine and Biology, 2010, vol. 55 (2), pp. N23-N38.
Deford J.F., et al., "An Impedance Method to Calculate Currents Induced in Biological Bodies Exposed to Quasi-Static Electromagnetic Fields", IEEE Transactions on Electromagnetic Compatibility, 1985, vol. 27 (3), pp. 168-173.
Federal Communications Commission, Office of Engineering Technology, Supplement C (Ed. 01-01) to OET Bulletin 65 (Ed. 97-01), "Evaluating Compliance with Fcc Guidelines for Human Exposure to Radiofrequency Electromagnetic Fields", Additional Information for Evaluating Compliance of Mobile and Portable Devices with FCC Limits for Human Exposure to Radiofrequency Emissions, FCC, Washington, DC, Jun. 2001, 57 pages.
Gosselin M-C., et al., "Estimation Formulas for the Specific Absorption Rate in Humans Exposed to Base-Station Antennas", IEEE Transactions on Electromagnetic Compatibility, 2011, vol. 53 (4), pp. 909-922.
Hasgall P.A., et al., "IT'IS Database for Thermal and Electromagnetic Parameters of Biological Tissues", Version 2.2, Jul. 11, 2012. [Online], Available: http://www.itis.ethz.ch/itis-for-health/tissue-properties/database/, 2 pages.
ICNIRP., "Guidelines for limiting exposure to time-varying electric and magnetic fields (1 Hz to 100 kHz)", Health Physics, 2010, vol. 99 (6), pp. 818-836.
ICNIRP., "Guidelines for Limiting Exposure to Time-Varying Electric, Magnetic and Electromagnetic Fields (up to 300 GHz)", Health Physics, 1998, vol. 74 (4), pp. 494-522.
ICNIRP., "Response to questions and comments on the guidelines for limiting exposure to time-varying electric, magnetic and electromagnetic fields (up to 300 GHz)", Health Physics, 1998, vol. 75 (4), pp. 171-175.
IEC Std. 62209-2:2010., "Human exposure to radio frequency fields from hand-held and body-mounted wireless communication devices - Human models, instrumentation, and procedures -Part 2: Procedure to determine the specific absorption rate (SAR) for wireless communication devices used in close proximity to the human body (frequency range of 30 MHz to 6 GHz)", IEC, Geneva, Switzerland, Jun. 2010, 122 pages.
IEEE Std. 1528.1 D1.0. IEEE Draft Standard for Recommended Practice for Determining the Spatial-Peak Specific Absorption Rate (SAR) in the Human Body Due to Wireless Communications Devices, 30 MHz-6 GHz: General Requirements for using the Finite Difference Time Domain (FDTD Method for SAR Calculations, IEEE, New York, NY, USA, Sep. 2010, 108 pages.
IEEE Std. C95.1:1991., "IEEE Standard for Safety Levels with Respect to Human Exposure to Radio Frequency Electromagnetic Fields, 3 kHz to 300 GHz", IEEE, New York, NY, 1992, 72 pages.
IEEE Std. C95.3.1:2010., "IEEE Recommended Practice for Measurements and Computations of Electric, Magnetic, and Electromagnetic Fields with Respect to Human Exposure to Such Fields, 0 Hz to 100 kHz", IEEE, New York, NY, USA, 2010, 100 pages.
Jürgens H.W., "Erhebung anthropometrischer Maβe zur Aktualisierung der DIN 33 402 - Teil 2", (Survey of anthropometric dimensions for the revision of DIN 33 402 - Part 2), Bundesanstalt für Arbeitsschutz und Arbeitsmedizin, Technical report, Schriftenreihe der Bundesanstalt für Arbeitsschutz und Arbeitsmedizin, (Monograph issued by the Federal Office for Occupational Safety, 2004, pp. 19, 29, 33 and 71..
Moerloose J.D., et al., "Reflection Analysis of PML ABC's for Low-Frequency Applications", IEEE Microwave and Guided Wave Letters, 1996, vol. 6 (4), pp. 177-179.
Nadakuduti J., et al., "Comparison of Different Safety Standards in Terms of Human Exposure to Electric and Magnetic Fields at 100 kHz", 33rd Annual Meeting of the Bioelectromagnetics Society (BEMS 2011), Halifax, Canada, Jun. 12-17, 2011, 5 pages..
Nadakuduti J., et al., "Compliance Testing Methodology for Wireless Power Transfer Systems", IEEE Transactions on Power Electronics, Nov. 2015, vol. 30, No. 11, pp. 6264-6273..
Taflove a., et al., "Computational Electrodynamics: the Finite-Difference Time-Domain Method", Artech House, Inc., Boston, USA, London, United Kingdom, Third Edition, Chapter 1, 2005, 30 pages..
Taflove a., et al., "Computational Electrodynamics: the Finite-Difference Time-Domain Method", Artech House, Inc., Boston, USA, London, United Kingdom, Third Edition, Chapter 4, 2005, pp. 107-164..

COMPLIANCE ASSESSMENT OF HUMAN EXPOSURE FROM WIRELESS ELECTRIC VEHICLE CHARGING SYSTEM USING AT LEAST ONE PHANTOM MODEL

CLAIM OF PRIORITY

The present application claims the benefit of U.S. Provisional Appl. Ser. No. 61/918,568 filed on Dec. 19, 2013 and incorporated in its entirety by reference herein.

FIELD

The present disclosure relates generally to wireless power transfer, and more specifically to devices, systems, and methods related to wireless power transfer to remote systems, such as vehicles including batteries, and assessing electromagnetic exposure from such wireless power transfer devices and systems.

BACKGROUND

Remote systems, such as vehicles, have been introduced that include locomotion power derived from electricity received from an energy storage device such as a battery. For example, hybrid electric vehicles include on-board chargers that use power from vehicle braking and traditional motors to charge the vehicles. Vehicles that are solely electric generally receive the electricity for charging the batteries from other sources. Battery electric vehicles (electric vehicles) are often proposed to be charged through some type of wired alternating current (AC) such as household or commercial AC supply sources. The wired charging connections require cables or other similar connectors that are physically connected to a power supply. Cables and similar connectors may sometimes be inconvenient or cumbersome and have other drawbacks. Wireless charging systems that are capable of transferring power in free space (e.g., via a wireless field) to be used to charge electric vehicles may overcome some of the deficiencies of wired charging solutions. As such, wireless charging systems and methods that efficiently and safely transfer power for charging electric vehicles.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an apparatus for assessing electromagnetic exposure. The apparatus comprises at least a first circuit configured to calculate electromagnetic exposure of at least a portion of at least one human in proximity to a wireless electric vehicle charging system. The portion of the at least one human is modeled by at least one homogeneous phantom model having dielectric properties that are representative of human tissue. The apparatus further comprises at least a second circuit configured to scale the calculated electromagnetic exposure to simulate an electromagnetic exposure based on an inhomogeneous anatomical model of the portion of the at least one human.

Another aspect of the disclosure provides an apparatus for assessing electromagnetic exposure. The apparatus comprises simulating means for simulating at least a portion of at least one human in proximity to a wireless electric vehicle charging system. The apparatus further comprises calculating means for calculating electromagnetic exposure of the portion of the at least one human. The portion of the at least one human is modeled by at least one homogeneous phantom model having dielectric properties that are representative of human tissue. The apparatus further comprises scaling means for scaling the calculated electromagnetic exposure to simulate an electromagnetic exposure based on an inhomogeneous anatomical model of the portion of the at least one human.

Another aspect of the disclosure provides a method for assessing electromagnetic exposure. The method comprises simulating at least a portion of at least one human in proximity to a wireless electric vehicle charging system. The method further comprises calculating electromagnetic exposure of the portion of the at least one human. The portion of the at least one human is modeled by at least one homogeneous phantom model having dielectric properties that are representative of human tissue. The method further comprises scaling the calculated electromagnetic exposure to simulate an electromagnetic exposure based on an inhomogeneous anatomical model of the portion of the at least one human.

Another aspect of the disclosure provides a non-transitory computer-readable medium for assessing electromagnetic exposure. The medium has encoded thereon instructions that when executed by a computer cause the computer to simulate at least a portion of at least one human in proximity to a wireless electric vehicle charging system. The instructions when executed by the computer further cause the computer to calculate electromagnetic exposure of the portion of the at least one human. The portion of the at least one human is modeled by at least one homogeneous phantom model having dielectric properties that are representative of human tissue. The instructions when executed by the computer further cause the computer to scale the calculated electromagnetic exposure to simulate an electromagnetic exposure based on an inhomogeneous anatomical model of the portion of the at least one human.

Figure 1:
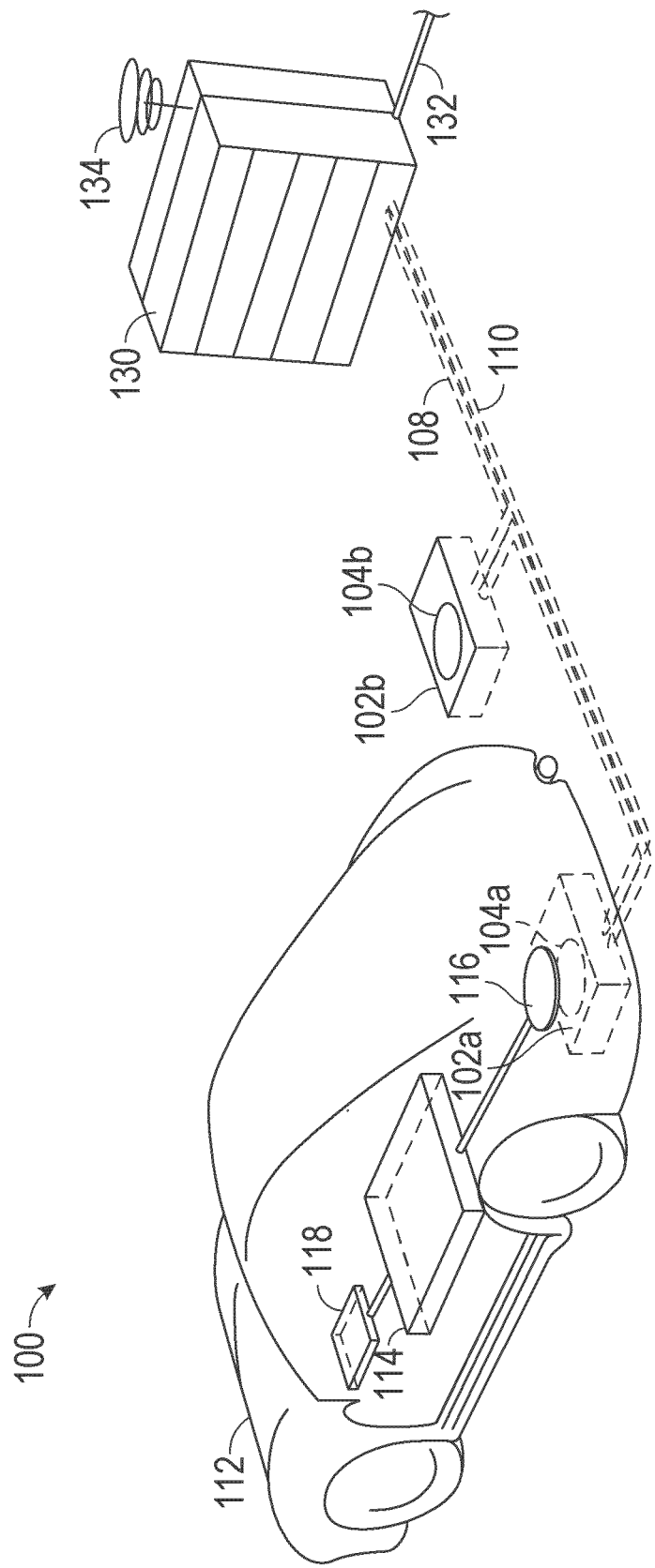
FIG. 1 is a diagram of an exemplary wireless power transfer system for charging an electric vehicle, in accordance with an exemplary embodiment of the invention.

The various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The detailed description set forth below in connection with the appended drawings is intended as a description of exemplary embodiments of the invention and is not intended to represent the only embodiments in which the invention may be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. In some instances, some devices are shown in block diagram form.

Wirelessly transferring power may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field) may be received, captured by, or coupled by a "receiving coil" to achieve power transfer.

An electric vehicle is used herein to describe a remote system, an example of which is a vehicle that includes, as part of its locomotion capabilities, electrical power derived from a chargeable energy storage device (e.g., one or more rechargeable electrochemical cells or other type of battery). As non-limiting examples, some electric vehicles may be hybrid electric vehicles that include besides electric motors, a traditional combustion engine for direct locomotion or to charge the vehicle's battery. Other electric vehicles may draw all locomotion ability from electrical power. An electric vehicle is not limited to an automobile and may include motorcycles, carts, scooters, and the like. By way of example and not limitation, a remote system is described herein in the form of an electric vehicle (EV). Furthermore, other remote systems that may be at least partially powered using a chargeable energy storage device are also contemplated (e.g., electronic devices such as personal computing devices and the like).

FIG. 1 is a diagram of an exemplary wireless power transfer system 100 for charging an electric vehicle 112, in accordance with an exemplary embodiment of the invention. The wireless power transfer system 100 enables charging of an electric vehicle 112 while the electric vehicle 112 is parked near a base wireless charging system 102a. Spaces for two electric vehicles are illustrated in a parking area to be parked over corresponding base wireless charging system 102a and 102b. In some embodiments, a local distribution center 130 may be connected to a power backbone 132 and configured to provide an alternating current (AC) or a direct current (DC) supply through a power link 110 to the base wireless charging system 102a. The base wireless charging system 102a also includes a base system induction coil 104a for wirelessly transferring or receiving power. An electric vehicle 112 may include a battery unit 118, an electric vehicle induction coil 116, and an electric vehicle wireless charging system 114. The electric vehicle induction coil 116 may interact with the base system induction coil 104a for example, via a region of the electromagnetic field generated by the base system induction coil 104a.

In some exemplary embodiments, the electric vehicle induction coil 116 may receive power when the electric vehicle induction coil 116 is located in an energy field produced by the base system induction coil 104a. The field corresponds to a region where energy output by the base system induction coil 104a may be captured by an electric vehicle induction coil 116. For example, the energy output by the base system induction coil 104a may be at a level sufficient to charge or power the electric vehicle 112. In some cases, the field may correspond to the "near field" of the base system induction coil 104a. The near-field may correspond to a region in which there are strong reactive fields resulting from the currents and charges in the base system induction coil 104a that do not radiate power away from the base system induction coil 104a. In some cases the near-field may correspond to a region that is within about ½π of wavelength of the base system induction coil 104a (and vice versa for the electric vehicle induction coil 116) as will be further described below.

Local distribution 1130 may be configured to communicate with external sources (e.g., a power grid) via a communication backhaul 134, and with the base wireless charging system 102a via a communication link 108.

In some embodiments the electric vehicle induction coil 116 may be aligned with the base system induction coil 104a and, therefore, disposed within a near-field region simply by the driver positioning the electric vehicle 112 correctly relative to the base system induction coil 104a. In other embodiments, the driver may be given visual feedback, auditory feedback, or combinations thereof to determine when the electric vehicle 112 is properly placed for wireless power transfer. In yet other embodiments, the electric vehicle 112 may be positioned by an autopilot system, which may move the electric vehicle 112 back and forth (e.g., in zig-zag movements) until an alignment error has reached a tolerable value. This may be performed automatically and autonomously by the electric vehicle 112 without or with only minimal driver intervention provided that the electric vehicle 112 is equipped with a servo steering wheel, ultrasonic sensors, and intelligence to adjust the vehicle. In still other embodiments, the electric vehicle induction coil 116, the base system induction coil 104a, or a combination thereof may have functionality for displacing and moving the induction coils 116 and 104a relative to each other to more accurately orient them and develop more efficient coupling therebetween.

The base wireless charging system 102a may be located in a variety of locations. As non-limiting examples, some suitable locations include a parking area at a home of the electric vehicle 112 owner, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention and manipulations thereby improving convenience to a user. There may also be no exposed electrical contacts and no mechanical wear out, thereby improving reliability of the wireless power transfer system 100. Manipulations with cables and connectors may not be needed, and there may be no cables, plugs, or sockets that may be exposed to moisture and water in an outdoor environment, thereby improving safety. There may also be no sockets, cables, and plugs visible or accessible, thereby reducing potential vandalism of power charging devices. Further, since an electric vehicle 112 may be used as distributed storage devices to stabilize a power grid, a docking-to-grid solution may be used to increase availability of vehicles for Vehicle-to-Grid (V2G) operation.

A wireless power transfer system 100 as described with reference to FIG. 1 may also provide aesthetical and non-impedimental advantages. For example, there may be no charge columns and cables that may be impedimental for vehicles and/or pedestrians.

As a further explanation of the vehicle-to-grid capability, the wireless power transmit and receive capabilities may be configured to be reciprocal such that the base wireless charging system 102a transfers power to the electric vehicle 112 and the electric vehicle 112 transfers power to the base wireless charging system 102a e.g., in times of energy shortfall. This capability may be useful to stabilize the power distribution grid by allowing electric vehicles to contribute power to the overall distribution system in times of energy shortfall caused by over demand or shortfall in renewable energy production (e.g., wind or solar).

Figure 2:
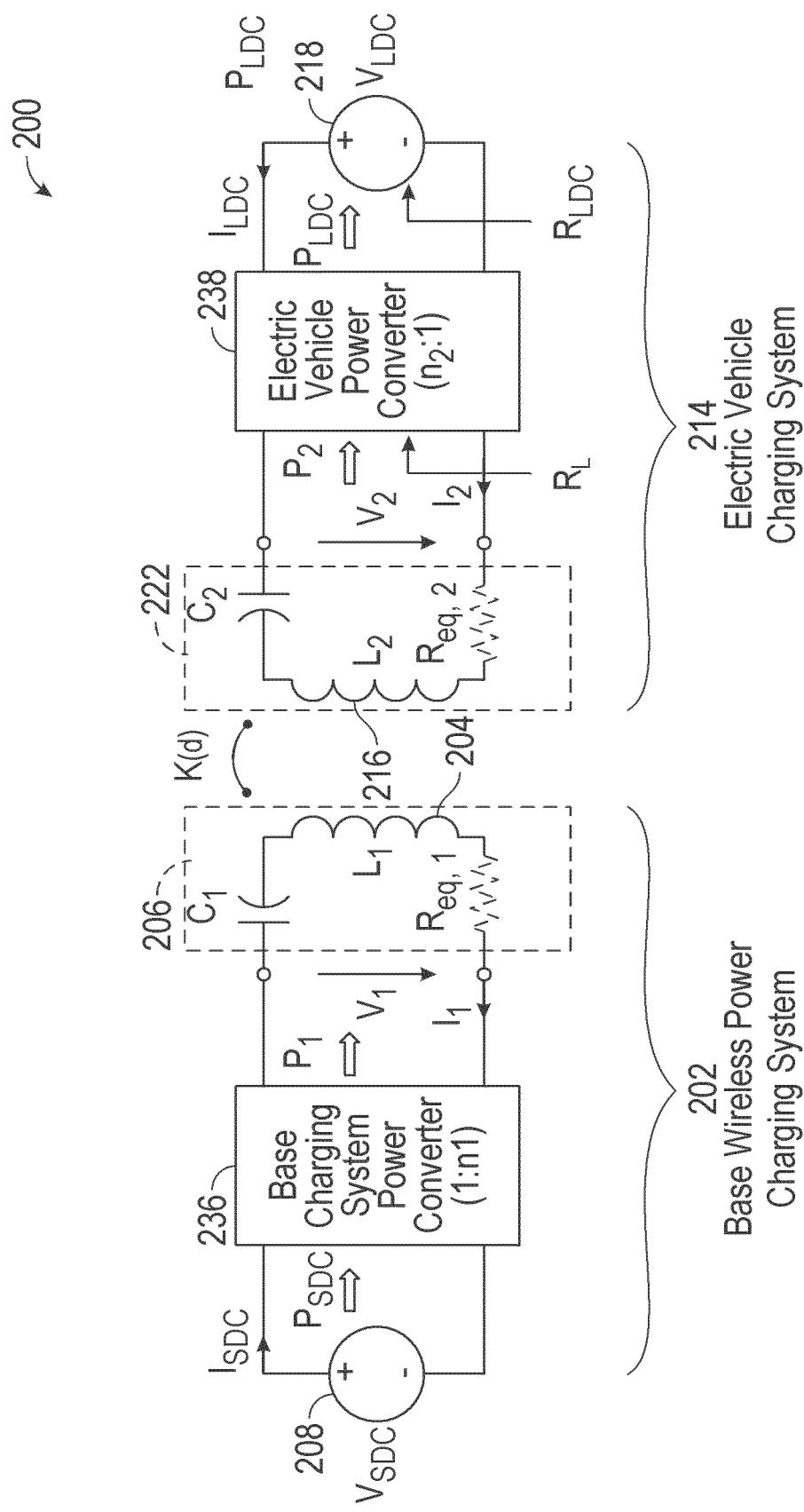
FIG. 2 is a schematic diagram of exemplary core components of the wireless power transfer system of FIG. 1.

FIG. 2 is a schematic diagram of exemplary core components of the wireless power transfer system 100 of FIG. 1. As shown in FIG. 2, the wireless power transfer system 200 may include a base system transmit circuit 206 including a base system induction coil 204 having an inductance $L_1$. The wireless power transfer system 200 further includes an electric vehicle receive circuit 222 including an electric vehicle induction coil 216 having an inductance $L_2$. Embodiments described herein may use capacitively loaded wire loops (i.e., multi-turn coils) forming a resonant structure that is capable of efficiently coupling energy from a primary structure (transmitter) to a secondary structure (receiver) via a magnetic or electromagnetic near field if both primary and secondary are tuned to a common resonant frequency. The coils may be used for the electric vehicle induction coil 216 and the base system induction coil 204. Using resonant structures for coupling energy may be referred to "magnetic coupled resonance," "electromagnetic coupled resonance," and/or "resonant induction." The operation of the wireless power transfer system 200 will be described based on power transfer from a base wireless power charging system 202 to an electric vehicle 112, but is not limited thereto. For example, as discussed above, the electric vehicle 112 may transfer power to the base wireless charging system 102a.

With reference to FIG. 2, a power supply 208 (e.g., AC or DC) supplies power $P_{SDC}$ to the base wireless power charging system 202 to transfer energy to an electric vehicle 112. The base wireless power charging system 202 includes a base charging system power converter 236. The base charging system power converter 236 may include circuitry such as an AC/DC converter configured to convert power from standard mains AC to DC power at a suitable voltage level, and a DC/low frequency (LF) converter configured to convert DC power to power at an operating frequency suitable for wireless high power transfer. The base charging system power converter 236 supplies power $P_1$ to the base system transmit circuit 206 including the capacitor $C_1$ in series with the base system induction coil 204 to emit an electromagnetic field at a desired frequency. The capacitor $C_1$ may be provided to form a resonant circuit with the base system induction coil 204 that resonates at a desired frequency. The base system induction coil 204 receives the power $P_1$ and wirelessly transmits power at a level sufficient to charge or power the electric vehicle 112. For example, the power level provided wirelessly by the base system induction coil 204 may be on the order of kilowatts (kW) (e.g., anywhere from 1 kW to 110 kW or higher or lower).

The base system transmit circuit 206 including the base system induction coil 204 and electric vehicle receive circuit 222 including the electric vehicle induction coil 216 may be tuned to substantially the same frequencies and may be positioned within the near-field of an electromagnetic field transmitted by one of the base system induction coil 204 and the electric vehicle induction coil 116. In this case, the base system induction coil 204 and electric vehicle induction coil 116 may become coupled to one another such that power may be transferred to the electric vehicle receive circuit 222 including capacitor $C_2$ and electric vehicle induction coil 116. The capacitor $C_2$ may be provided to form a resonant circuit with the electric vehicle induction coil 216 that resonates at a desired frequency. Element k(d) represents the mutual coupling coefficient resulting at coil separation. Equivalent resistances $R_{eq.1}$ and $R_{eq.2}$ represent the losses that may be inherent to the induction coils 204 and 216 and the anti-reactance capacitors $C_1$ and $C_2$. The electric vehicle receive circuit 222 including the electric vehicle induction coil 316 and capacitor $C_2$ receives power $P_2$ and provides the power $P_2$ to an electric vehicle power converter 238 of an electric vehicle charging system 214.

The electric vehicle power converter 238 may include, among other things, a LF/DC converter configured to convert power at an operating frequency back to DC power at a voltage level matched to the voltage level of an electric vehicle battery unit 218. The electric vehicle power converter 238 may provide the converted power $P_{LDC}$ to charge the electric vehicle battery unit 218. The power supply 208, base charging system power converter 236, and base system induction coil 204 may be stationary and located at a variety of locations as discussed above. The battery unit 218, electric vehicle power converter 238, and electric vehicle induction coil 216 may be included in an electric vehicle charging system 214 that is part of electric vehicle 112 or part of the battery pack (not shown). The electric vehicle charging system 214 may also be configured to provide power wirelessly through the electric vehicle induction coil 216 to the base wireless power charging system 202 to feed power back to the grid. Each of the electric vehicle induction coil 216 and the base system induction coil 204 may act as transmit or receive induction coils based on the mode of operation.

While not shown, the wireless power transfer system 200 may include a load disconnect unit (LDU) to safely disconnect the electric vehicle battery unit 218 or the power supply 208 from the wireless power transfer system 200. For example, in case of an emergency or system failure, the LDU may be triggered to disconnect the load from the wireless power transfer system 200. The LDU may be provided in addition to a battery management system for managing charging to a battery, or it may be part of the battery management system.

Further, the electric vehicle charging system 214 may include switching circuitry (not shown) for selectively connecting and disconnecting the electric vehicle induction coil 216 to the electric vehicle power converter 238. Disconnecting the electric vehicle induction coil 216 may suspend charging and also may adjust the "load" as "seen" by the base wireless charging system 102a (acting as a transmitter), which may be used to "cloak" the electric vehicle charging system 114 (acting as the receiver) from the base wireless charging system 102a. The load changes may be detected if the transmitter includes the load sensing circuit. Accordingly, the transmitter, such as a base wireless charging system 202, may have a mechanism for determining when receivers, such as an electric vehicle charging system 114, are present in the near-field of the base system induction coil 204.

As described above, in operation, assuming energy transfer towards the vehicle or battery, input power is provided from the power supply 208 such that the base system induction coil 204 generates a field for providing the energy transfer. The electric vehicle induction coil 216 couples to the radiated field and generates output power for storage or consumption by the electric vehicle 112. As described above, in some embodiments, the base system induction coil 204 and electric vehicle induction coil 116 are configured according to a mutual resonant relationship such that when the resonant frequency of the electric vehicle induction coil 116 and the resonant frequency of the base system induction coil 204 are very close or substantially the same. Transmission losses between the base wireless power charging system 202 and electric vehicle charging system 214 are minimal when the electric vehicle induction coil 216 is located in the near-field of the base system induction coil 204.

As stated, an efficient energy transfer occurs by coupling a large portion of the energy in the near field of a transmitting induction coil to a receiving induction coil rather than propagating most of the energy in an electromagnetic wave to the far-field. When in the near field, a coupling mode may be established between the transmit induction coil and the receive induction coil. The area around the induction coils where this near field coupling may occur is referred to herein as a near field coupling mode region.

While not shown, the base charging system power converter 236 and the electric vehicle power converter 238 may both include an oscillator, a driver circuit such as a power amplifier, a filter, and a matching circuit for efficient coupling with the wireless power induction coil. The oscillator may be configured to generate a desired frequency, which may be adjusted in response to an adjustment signal. The oscillator signal may be amplified by a power amplifier with an amplification amount responsive to control signals. The filter and matching circuit may be included to filter out harmonics or other unwanted frequencies and match the impedance of the power conversion module to the wireless power induction coil. The power converters 236 and 238 may also include a rectifier and switching circuitry to generate a suitable power output to charge the battery.

The electric vehicle induction coil 216 and base system induction coil 204 as described throughout the disclosed embodiments may be referred to or configured as "loop" antennas, and more specifically, multi-turn loop antennas. The induction coils 204 and 216 may also be referred to herein or be configured as "magnetic" antennas. The term "coil" generally refers to a component that may wirelessly output or receive energy four coupling to another "coil." The coil may also be referred to as an "antenna" of a type that is configured to wirelessly output or receive power. As used herein, coils 204 and 216 are examples of "power transfer components" of a type that are configured to wirelessly output, wirelessly receive, and/or wirelessly relay power. Loop (e.g., multi-turn loop) antennas may be configured to include an air core or a physical core such as a ferrite core. An air core loop antenna may allow the placement of other components within the core area. Physical core antennas including ferromagnetic or ferromagnetic materials may allow development of a stronger electromagnetic field and improved coupling.

As discussed above, efficient transfer of energy between a transmitter and receiver occurs during matched or nearly matched resonance between a transmitter and a receiver. However, even when resonance between a transmitter and receiver are not matched, energy may be transferred at a lower efficiency. Transfer of energy occurs by coupling energy from the near field of the transmitting induction coil to the receiving induction coil residing within a region (e.g., within a predetermined frequency range of the resonant frequency, or within a predetermined distance of the near-field region) where this near field is established rather than propagating the energy from the transmitting induction coil into free space.

A resonant frequency may be based on the inductance and capacitance of a transmit circuit including an induction coil (e.g., the base system induction coil 204) as described above. As shown in FIG. 2, inductance may generally be the inductance of the induction coil, whereas, capacitance may be added to the induction coil to create a resonant structure at a desired resonant frequency. As a non limiting example, as shown in FIG. 2, a capacitor may be added in series with the induction coil to create a resonant circuit (e.g., the base system transmit circuit 206) that generates an electromagnetic field. Accordingly, for larger diameter induction coils, the value of capacitance needed to induce resonance may decrease as the diameter or inductance of the coil increases. Inductance may also depend on a number of turns of an induction coil. Furthermore, as the diameter of the induction coil increases, the efficient energy transfer area of the near field may increase. Other resonant circuits are possible. As another non limiting example, a capacitor may be placed in parallel between the two terminals of the induction coil (e.g., a parallel resonant circuit). Furthermore an induction coil may be designed to have a high quality (Q) factor to improve the resonance of the induction coil. For example, the Q factor may be 300 or greater.

As described above, according to some embodiments, coupling power between two induction coils that are in the near field of one another is disclosed. As described above, the near field may correspond to a region around the induction coil in which electromagnetic fields exist but may not propagate or radiate away from the induction coil. Near-field coupling-mode regions may correspond to a volume that is near the physical volume of the induction coil, typically within a small fraction of the wavelength. According to some embodiments, electromagnetic induction coils, such as single and multi turn loop antennas, are used for both transmitting and receiving since magnetic near field amplitudes in practical embodiments tend to be higher for magnetic type coils in comparison to the electric near fields of an electric type antenna (e.g., a small dipole). This allows for potentially higher coupling between the pair. Furthermore, "electric" antennas (e.g., dipoles and monopoles) or a combination of magnetic and electric antennas may be used.

Figure 3:
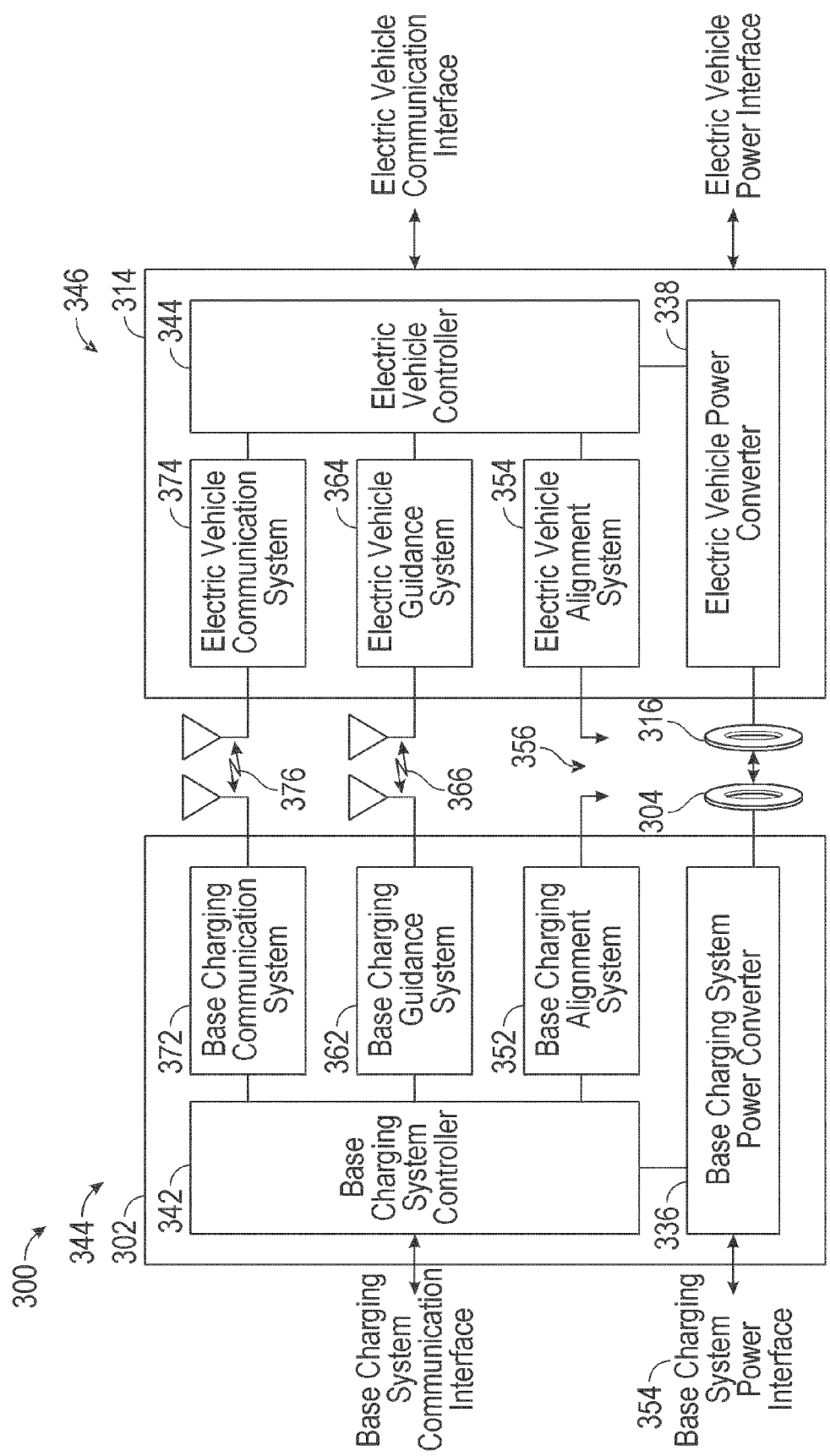
FIG. 3 is another functional block diagram showing exemplary core and ancillary components of the wireless power transfer system of FIG. 1.

FIG. 3 is another functional block diagram showing exemplary core and ancillary components of the wireless power transfer system 300 of FIG. 1. The wireless power transfer system 300 illustrates a communication link 376, a guidance link 366, and alignment systems 352, 354 for the base system induction coil 304 and electric vehicle induction coil 316. As described above with reference to FIG. 2, and assuming energy flow towards the electric vehicle 112, in FIG. 3 a base charging system power interface 354 may be configured to provide power to a charging system power converter 336 from a power source, such as an AC or DC power supply 126. The base charging system power converter 336 may receive AC or DC power from the base charging system power interface 354 to excite the base system induction coil 304 at or near its resonant frequency. The electric vehicle induction coil 316, when in the near field coupling-mode region, may receive energy from the near field coupling mode region to oscillate at or near the resonant frequency. The electric vehicle power converter 338 converts the oscillating signal from the electric vehicle induction coil 316 to a power signal suitable for charging a battery via the electric vehicle power interface.

The base wireless charging system 302 includes a base charging system controller 342 and the electric vehicle charging system 314 includes an electric vehicle controller 344. The base charging system controller 342 may include a base charging system communication interface 162 to other systems (not shown) such as, for example, a computer, and a power distribution center, or a smart power grid. The electric vehicle controller 344 may include an electric vehicle communication interface to other systems (not shown) such as, for example, an on-board computer on the vehicle, other battery charging controller, other electronic systems within the vehicles, and remote electronic systems.

The base charging system controller 342 and electric vehicle controller 344 may include subsystems or modules for specific application with separate communication channels. These communications channels may be separate physical channels or separate logical channels. As non-limiting examples, a base charging alignment system 352 may communicate with an electric vehicle alignment system 354 through a communication link 376 to provide a feedback mechanism for more closely aligning the base system induction coil 304 and electric vehicle induction coil 316, either autonomously or with operator assistance. Similarly, a base charging guidance system 362 may communicate with an electric vehicle guidance system 364 through a guidance link to provide a feedback mechanism to guide an operator in aligning the base system induction coil 304 and electric vehicle induction coil 316. In addition, there may be separate general-purpose communication links (e.g., channels) supported by base charging communication system 372 and electric vehicle communication system 374 for communicating other information between the base wireless power charging system 302 and the electric vehicle charging system 314. This information may include information about electric vehicle characteristics, battery characteristics, charging status, and power capabilities of both the base wireless power charging system 302 and the electric vehicle charging system 314, as well as maintenance and diagnostic data for the electric vehicle 112. These communication channels may be separate physical communication channels such as, for example, Bluetooth, zigbee, cellular, etc.

Electric vehicle controller 344 may also include a battery management system (BMS) (not shown) that manages charge and discharge of the electric vehicle principal battery, a parking assistance system based on microwave or ultrasonic radar principles, a brake system configured to perform a semi-automatic parking operation, and a steering wheel servo system configured to assist with a largely automated parking 'park by wire' that may provide higher parking accuracy, thus reducing the need for mechanical horizontal induction coil alignment in any of the base wireless charging system 102a and the electric vehicle charging system 114. Further, electric vehicle controller 344 may be configured to communicate with electronics of the electric vehicle 112. For example, electric vehicle controller 344 may be configured to communicate with visual output devices (e.g., a dashboard display), acoustic/audio output devices (e.g., buzzer, speakers), mechanical input devices (e.g., keyboard, touch screen, and pointing devices such as joystick, trackball, etc.), and audio input devices (e.g., microphone with electronic voice recognition).

Furthermore, the wireless power transfer system 300 may include detection and sensor systems. For example, the wireless power transfer system 300 may include sensors for use with systems to properly guide the driver or the vehicle to the charging spot, sensors to mutually align the induction coils with the required separation/coupling, sensors to detect objects that may obstruct the electric vehicle induction coil 316 from moving to a particular height and/or position to achieve coupling, and safety sensors for use with systems to perform a reliable, damage free, and safe operation of the system. For example, a safety sensor may include a sensor for detection of presence of animals or children approaching the wireless power induction coils 104a, 116 beyond a safety radius, detection of metal objects near the base system induction coil 304 that may be heated up (induction heating), detection of hazardous events such as incandescent objects on the base system induction coil 304, and temperature monitoring of the base wireless power charging system 302 and electric vehicle charging system 314 components.

The wireless power transfer system 300 may also support plug-in charging via a wired connection. A wired charge port may integrate the outputs of the two different chargers prior to transferring power to or from the electric vehicle 112. Switching circuits may provide the functionality as needed to support both wireless charging and charging via a wired charge port.

To communicate between a base wireless charging system 302 and an electric vehicle charging system 314, the wireless power transfer system 300 may use both in-band signaling and an RF data modem (e.g., Ethernet over radio in an unlicensed band). The out-of-band communication may provide sufficient bandwidth for the allocation of value-add services to the vehicle user/owner. A low depth amplitude or phase modulation of the wireless power carrier may serve as an in-band signaling system with minimal interference.

In addition, some communication may be performed via the wireless power link without using specific communications antennas. For example, the wireless power induction coils 304 and 316 may also be configured to act as wireless communication transmitters. Thus, some embodiments of the base wireless power charging system 302 may include a controller (not shown) for enabling keying type protocol on the wireless power path. By keying the transmit power level (amplitude shift keying) at predefined intervals with a predefined protocol, the receiver may detect a serial communication from the transmitter. The base charging system power converter 336 may include a load sensing circuit (not shown) for detecting the presence or absence of active electric vehicle receivers in the vicinity of the near field generated by the base system induction coil 304. By way of example, a load sensing circuit monitors the current flowing to the power amplifier, which is affected by the presence or absence of active receivers in the vicinity of the near field generated by base system induction coil 104a. Detection of changes to the loading on the power amplifier may be monitored by the base charging system controller 342 for use in determining whether to enable the oscillator for transmitting energy, to communicate with an active receiver, or a combination thereof.

To enable wireless high power transfer, some embodiments may be configured to transfer power at a frequency in the range from 10-60 kHz. This low frequency coupling may allow highly efficient power conversion that may be achieved using solid state devices. In addition, there may be less coexistence issues with radio systems compared to other bands.

Figure 4:
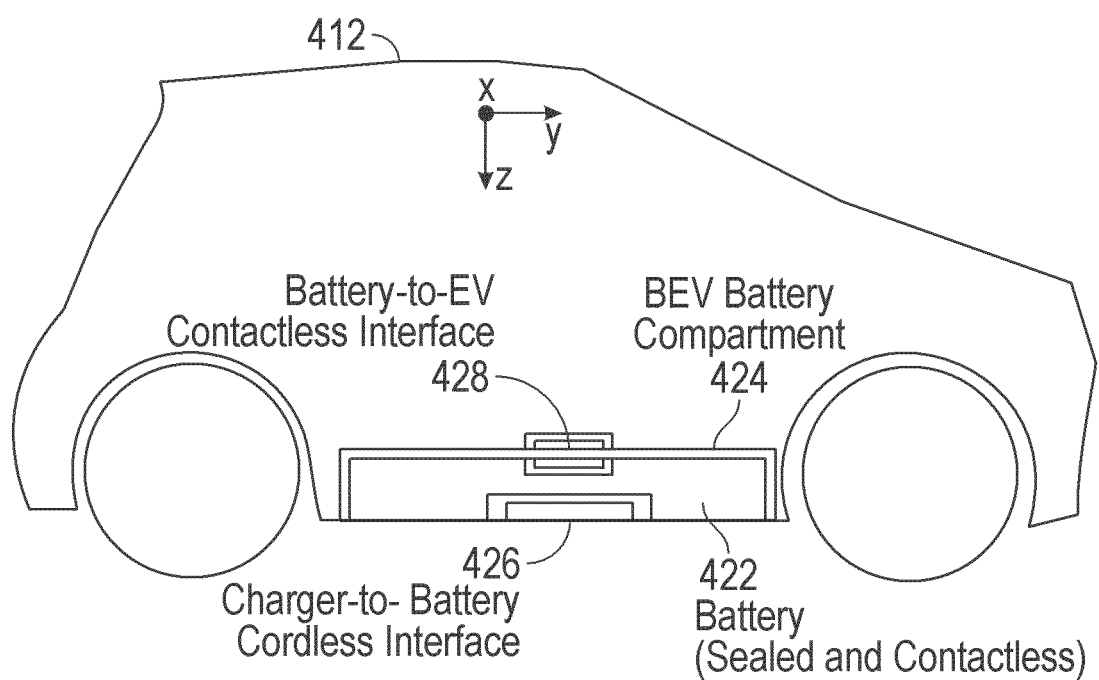
FIG. 4 is a functional block diagram showing a replaceable contactless battery disposed in an electric vehicle, in accordance with an exemplary embodiment of the invention.

The wireless power transfer system 100 described may be used with a variety of electric vehicles 102 including rechargeable or replaceable batteries. FIG. 4 is a functional block diagram showing a replaceable contactless battery disposed in an electric vehicle 412, in accordance with an exemplary embodiment of the invention. In this embodiment, the low battery position may be useful for an electric vehicle battery unit that integrates a wireless power interface (e.g., a charger-to-battery cordless interface 426) and that may receive power from a charger (not shown) embedded in the ground. In FIG. 4, the electric vehicle battery unit may be a rechargeable battery unit, and may be accommodated in a battery compartment 424. The electric vehicle battery unit also provides a wireless power interface 426, which may integrate the entire electric vehicle wireless power subsystem including a resonant induction coil, power conversion circuitry, and other control and communications functions as needed for efficient and safe wireless energy transfer between a ground-based wireless charging unit and the electric vehicle battery unit.

It may be useful for the electric vehicle induction coil to be integrated flush with a bottom side of electric vehicle battery unit or the vehicle body so that there are no protrusive parts and so that the specified ground-to-vehicle body clearance may be maintained. This configuration may require some room in the electric vehicle battery unit dedicated to the electric vehicle wireless power subsystem. The electric vehicle battery unit 422 may also include a battery-to-EV cordless interface 422, and a charger-to-battery cordless interface 426 that provides contactless power and communication between the electric vehicle 412 and a base wireless charging system 102a as shown in FIG. 1.

In some embodiments, and with reference to FIG. 1, the base system induction coil 104a and the electric vehicle induction coil 116 may be in a fixed position and the induction coils are brought within a near-field coupling region by overall placement of the electric vehicle induction coil 116 relative to the base wireless charging system 102a. However, in order to perform energy transfer rapidly, efficiently, and safely, the distance between the base system induction coil 104a and the electric vehicle induction coil 116 may need to be reduced to improve coupling. Thus, in some embodiments, the base system induction coil 104a and/or the electric vehicle induction coil 116 may be deployable and/or moveable to bring them into better alignment.

Figure 5A:
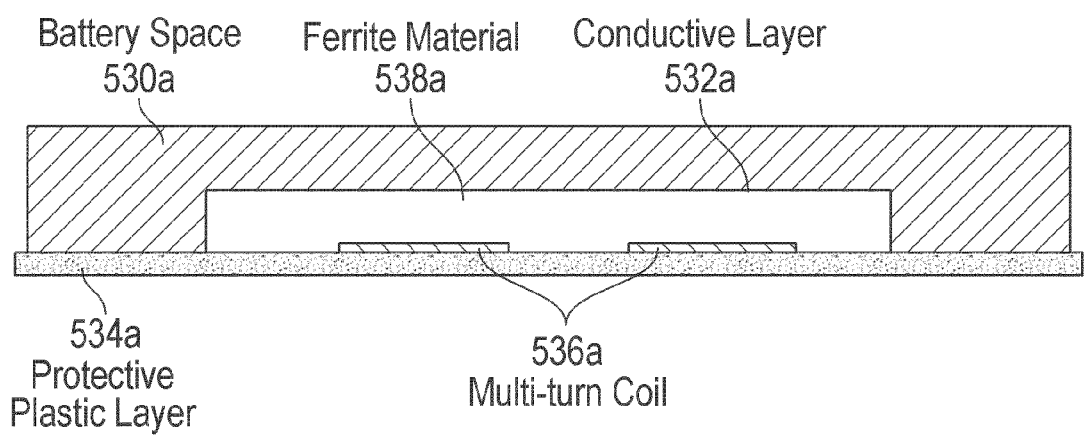
FIGS. 5A, 5B, 5C, and 5D are diagrams of exemplary configurations for the placement of an induction coil and ferrite material relative to a battery, in accordance with exemplary embodiments of the invention.

FIGS. 5A, 5B, 5C, and 5D are diagrams of exemplary configurations for the placement of an induction coil and ferrite material relative to a battery, in accordance with exemplary embodiments of the invention. FIG. 5A shows a fully ferrite embedded induction coil 536a. The wireless power induction coil may include a ferrite material 538a and a coil 536a wound about the ferrite material 538a. The coil 536a itself may be made of stranded Litz wire. A conductive shield 532a may be provided to protect passengers of the vehicle from excessive EMF transmission. Conductive shielding may be particularly useful in vehicles made of plastic or composites.

Figure 5B:
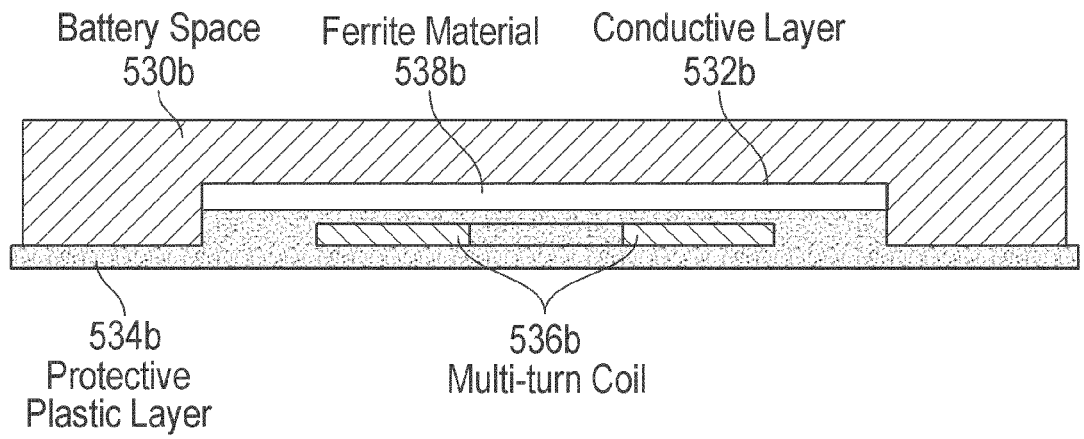

FIG. 5B shows an optimally dimensioned ferrite plate (i.e., ferrite backing) to enhance coupling and to reduce eddy currents (heat dissipation) in the conductive shield 532b. The coil 536b may be fully embedded in a non-conducting non-magnetic (e.g., plastic) material. For example, as illustrated in FIG. 5A-5D, the coil 536b may be embedded in a protective housing 534b. There may be a separation between the coil 536b and the ferrite material 538b as the result of a trade-off between magnetic coupling and ferrite hysteresis losses.

Figure 5C:
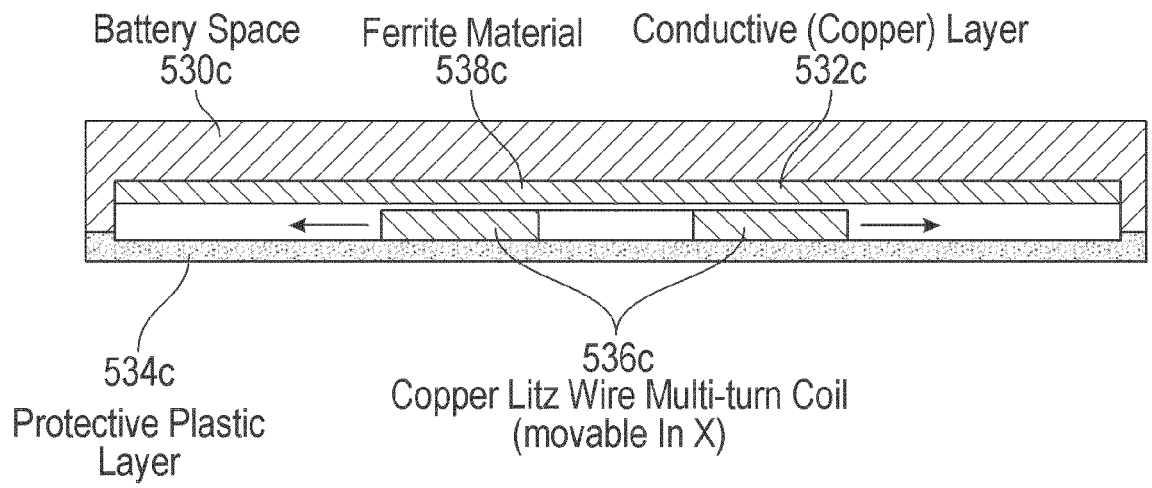
Figure 5D:
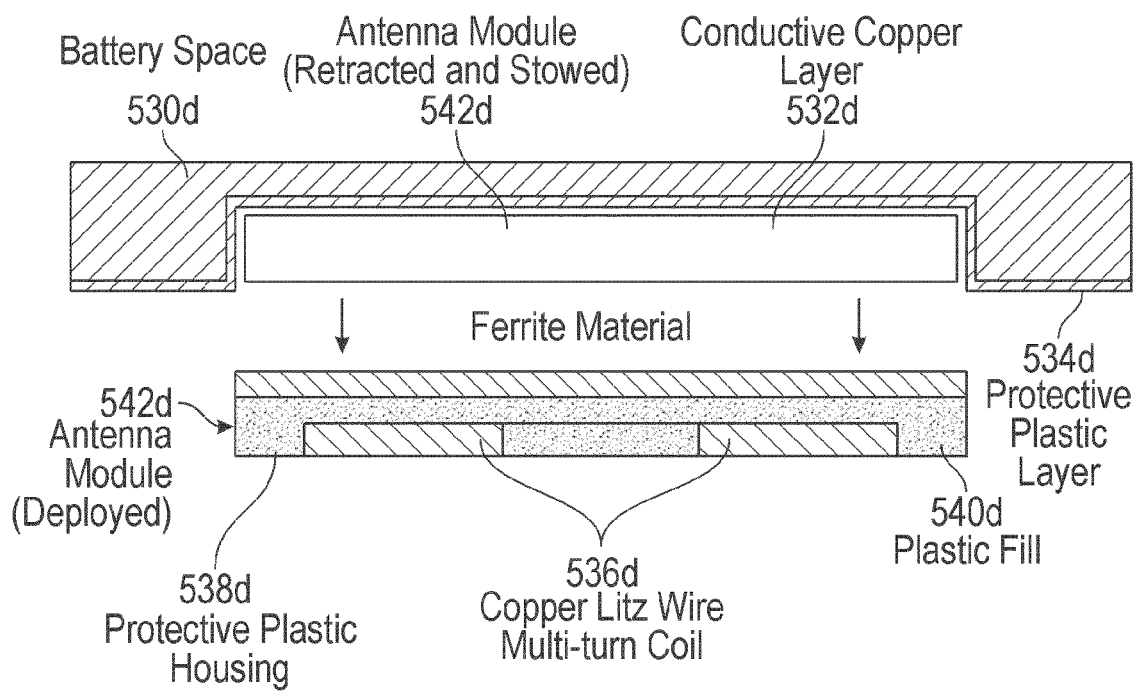

FIG. 5C illustrates another embodiment where the coil 536c (e.g., a copper Litz wire multi-turn coil) may be movable in a lateral ("X") direction. FIG. 5D illustrates another embodiment where the induction coil module is deployed in a downward direction. In some embodiments, the battery unit includes one of a deployable and non-deployable electric vehicle induction coil module 540d as part of the wireless power interface. To prevent magnetic fields from penetrating into the battery space 530d and into the interior of the vehicle, there may be a conductive shield 532d (e.g., a copper sheet) between the battery space 530d and the vehicle. Furthermore, a non-conductive (e.g., plastic) protective layer 533d may be used to protect the conductive shield 532d, the coil 536d, and the ferrite material 5d38 from environmental impacts (e.g., mechanical damage, oxidization, etc.). Furthermore, the coil 536d may be movable in lateral X and/or Y directions. FIG. 5D illustrates an embodiment wherein the electric vehicle induction coil module 540d is deployed in a downward Z direction relative to a battery unit body.

The design of this deployable electric vehicle induction coil module 542b is similar to that of FIG. 5B except there is no conductive shielding at the electric vehicle induction coil module 542d. The conductive shield 532d stays with the battery unit body. The protective layer 533d (e.g., plastic layer) is provided between the conductive shield 432d and the electric vehicle induction coil module 542d when the electric vehicle induction coil module 542d is not in a deployed state. The physical separation of the electric vehicle induction coil module 542 from the battery unit body may have a positive effect on the induction coil's performance.

As discussed above, the electric vehicle induction coil module 542d that is deployed may contain only the coil 536d (e.g., Litz wire) and ferrite material 538d. Ferrite backing may be provided to enhance coupling and to prevent from excessive eddy current losses in a vehicle's underbody or in the conductive shield 532d. Moreover, the electric vehicle induction coil module 542d may include a flexible wire connection to power conversion electronics and sensor electronics. This wire bundle may be integrated into the mechanical gear for deploying the electric vehicle induction coil module 542d.

With reference to FIG. 1, the charging systems described above may be used in a variety of locations for charging an electric vehicle 112, or transferring power back to a power grid. For example, the transfer of power may occur in a parking lot environment. It is noted that a "parking area" may also be referred to herein as a "parking space." To enhance the efficiency of a vehicle wireless power transfer system 100, an electric vehicle 112 may be aligned along an X direction and a Y direction to enable an electric vehicle induction coil 116 within the electric vehicle 112 to be adequately aligned with a base wireless charging system 102a within an associated parking area.

Furthermore, the disclosed embodiments are applicable to parking lots having one or more parking spaces or parking areas, wherein at least one parking space within a parking lot may comprise a base wireless charging system 102a. Guidance systems (not shown) may be used to assist a vehicle operator in positioning an electric vehicle 112 in a parking area to align an electric vehicle induction coil 116 within the electric vehicle 112 with a base wireless charging system 102a. Guidance systems may include electronic based approaches (e.g., radio positioning, direction finding principles, and/or optical, quasi-optical and/or ultrasonic sensing methods) or mechanical-based approaches (e.g., vehicle wheel guides, tracks or stops), or any combination thereof, for assisting an electric vehicle operator in positioning an electric vehicle 112 to enable an induction coil 116 within the electric vehicle 112 to be adequately aligned with a charging induction coil within a charging base (e.g., base wireless charging system 102a).

As discussed above, the electric vehicle charging system 114 may be placed on the underside of the electric vehicle 112 for transmitting and receiving power from a base wireless charging system 102a. For example, an electric vehicle induction coil 116 may be integrated into the vehicles underbody preferably near a center position providing maximum safety distance in regards to EM exposure and permitting forward and reverse parking of the electric vehicle.

Figure 6:
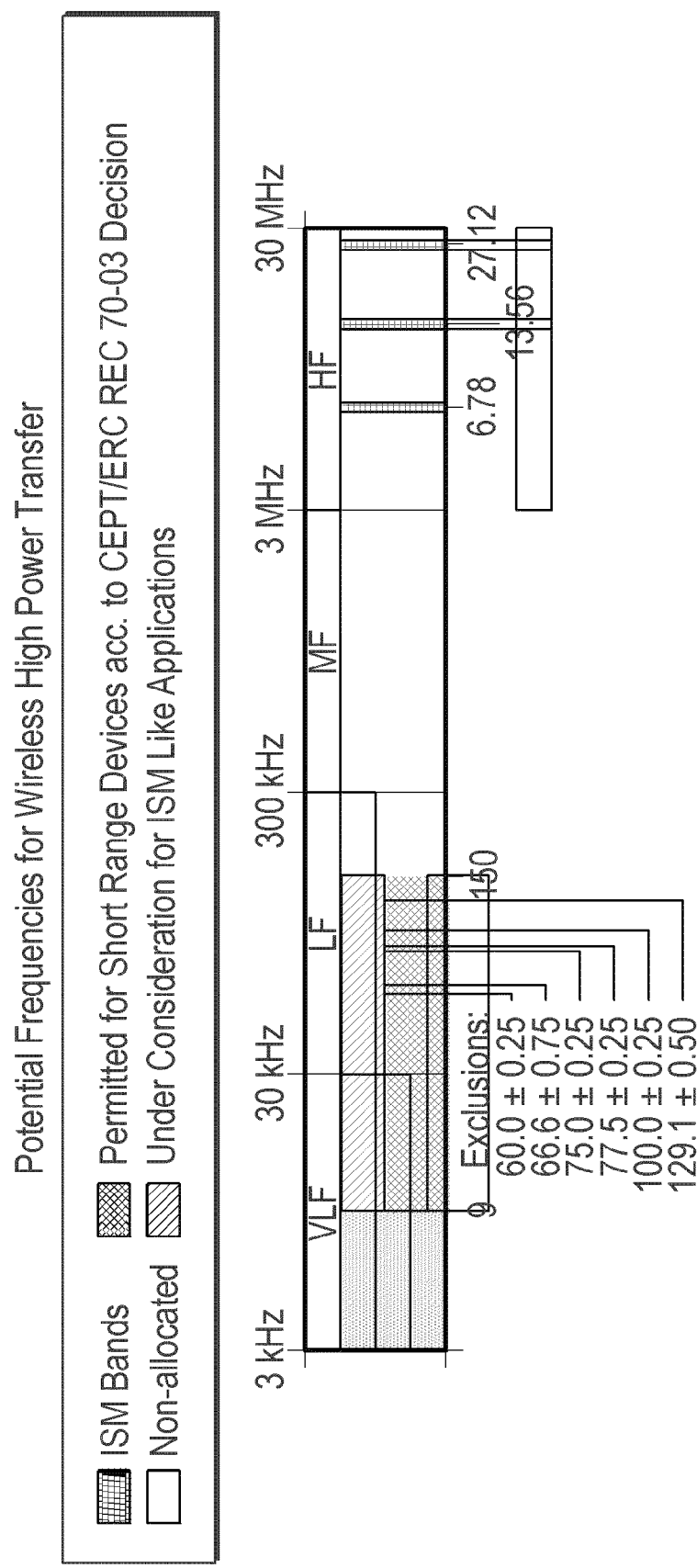
FIG. 6 is a chart of a frequency spectrum showing exemplary frequencies that may be available for wireless charging an electric vehicle, in accordance with an exemplary embodiment of the invention.

FIG. 6 is a chart of a frequency spectrum showing exemplary frequencies that may be used for wireless charging an electric vehicle, in accordance with an exemplary embodiment of the invention. As shown in FIG. 6, potential frequency ranges for wireless high power transfer to electric vehicles may include: VLF in a 3 kHz to 30 kHz band, lower LF in a 30 kHz to 150 kHz band (for ISM-like applications) with some exclusions, HF 6.78 MHz (ITU-R ISM-Band 6.765-6.795 MHz), HF 13.56 MHz (ITU-R ISM-Band 13.553-13.567), and HF 27.12 MHz (ITU-R ISM-Band 26.957-27.283).

Figure 7:
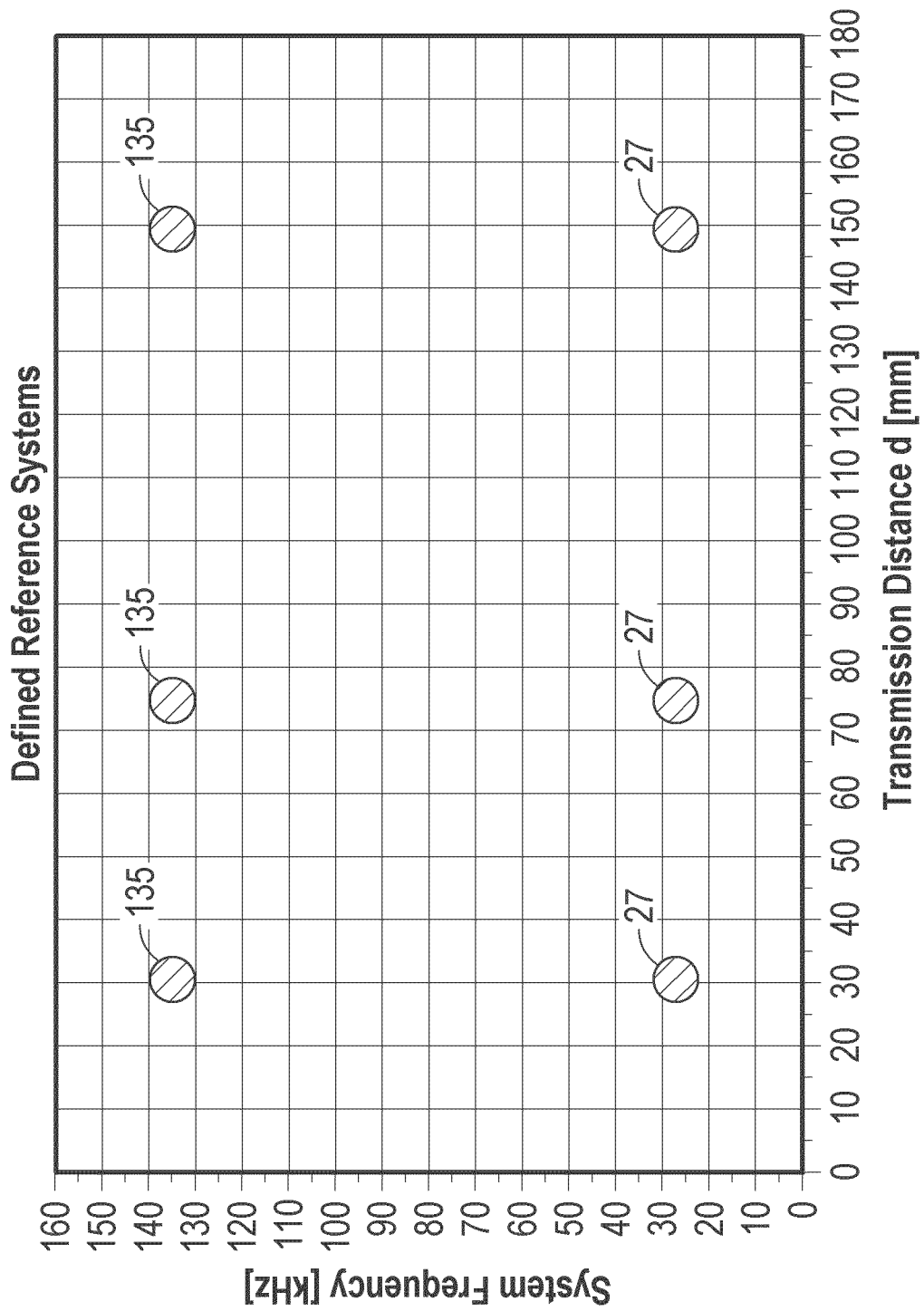
FIG. 7 is a chart showing exemplary frequencies and transmission distances that may be useful in wireless charging electric vehicles, in accordance with an exemplary embodiment of the invention.

FIG. 7 is a chart showing exemplary frequencies and transmission distances that may be useful in wireless charging electric vehicles, in accordance with an exemplary embodiment of the invention. Some example transmission distances that may be useful for electric vehicle wireless charging are about 30 mm, about 75 mm, and about 150 mm. Some exemplary frequencies may be about 27 kHz in the VLF band and about 135 kHz in the LF band.

As with any wireless system that emits electric fields or magnetic fields or both, it can be helpful to study the electromagnetic exposure in humans who are in close proximity of such systems. Currents and electric fields are induced inside a human body when exposed to electromagnetic fields. International bodies like IEEE and ICNIRP provide guidelines that define limits on the induced fields based on known biological effects. These limits are described more fully below as well as an approach using a combination of numerical simulations and experimental validation to perform an assessment of the human exposure from wireless electric vehicle charging systems.

Growing electric vehicles share in the market due to obvious advantages over conventional gas-powered vehicles has led to the advancement of charging the batteries in the electric vehicles wirelessly. For example, a Wireless Electric Vehicle Charging (WEVC) system (e.g., located on the floor) can detect a wireless charging-enabled electric vehicle when parked over the WEVC and can start charging. Thus, the electric vehicle will charge and be ready for operation without the need to plug the electric vehicle in an electrical power outlet.

Wirelessly charging consumer electronics has become popular in recent years finding applications in tooth brushes, cell phones, laptops/tablets, audio/video units, medical implants like pacemakers, etc. Demonstrating compliance with the electric and magnetic-field emissions, as well as with the induced fields inside humans who are in close proximity, is desirable prior to releasing the product in the market. Since WEVC systems typically operate at low frequencies (~100 kHz), where there are no standardized procedures to demonstrate compliance with the induced fields inside humans, it is desirable to develop new approaches. Certain embodiments described herein provide an approach employing both numerical electromagnetic simulations as well as field measurements (e.g., for validation) for the assessment of the induced fields from WEVC systems. (See, also, J. Nadakuduti, M. G. Douglas, L. Lu, P. Guckian and N. Kuster, "*Proposing a Compliance Testing Methodology for Exposure Assessment of Wireless Power Transfer Systems with Demonstration at 6.78 MHz,*" IEEE Transactions on Power Electronics, submitted 2014.)

Figure 8:
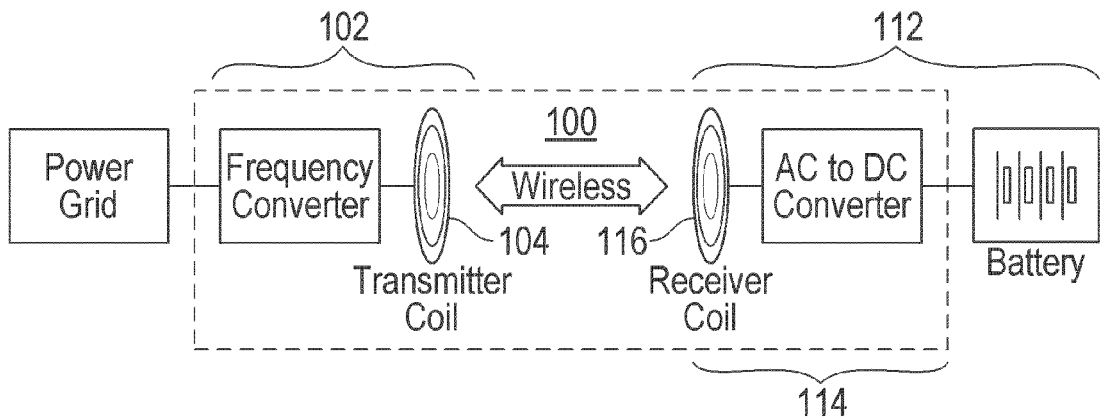
FIG. 8 schematically illustrates an example wireless electric vehicle charging (WEVC) system.

FIG. 8 schematically illustrates an example WEVC system 100 in accordance with certain embodiments described herein. The WEVC system 100 transfers electrical energy from the power grid to an electrical load (e.g., battery) inside the electric vehicle 112 via electric and or magnetic fields or waves between at least one base wireless charging system 102 having at least one base system induction coil 104 (e.g., a transmitter coil) and at least one vehicle wireless charging system 114 of the electric vehicle 112 and comprising at least one electric vehicle induction coil 116 (e.g., a receiver coil). Various other examples of the wireless electric vehicle charging system 100 compatible with certain embodiments are described herein.

Electric fields emanating from WEVC systems are highly localized around the transmitter and receiver coils. Magnetic field emissions around the WEVC system can be dominant since these systems are operated with coils carrying high currents. Therefore, electromotive force (EMF) proportional to the rate of change in coupled magnetic flux (Faraday's law of induction) is induced inside humans present near the WEVC system. This EMF results in induced electric fields (and currents) inside the human body, which vary depending on the conductivity of human tissue as well as the inhomogeneity of human tissue structure.

International bodies, such as the International Commission on Non-Ionizing Radiation Protection (ICNIRP) and the Institute of Electrical and Electronics Engineers (IEEE), provide guidelines to limit the human exposure from time-varying electric, magnetic and electromagnetic fields. (See, e.g., ICNIRP 1998, *"Guidelines for limiting exposure to time-varying electric, magnetic and electromagnetic fields* (up to 300 GHz)," Health Physics, 74(4):494-522, 1998; ICNIRP 2010, *"Guidelines for limiting exposure to time-varying electric and magnetic fields* (1 Hz to 100 kHz)," Health Physics, 99(6):818-836, 2010; IEEE Std. C95.1: 1992, *"IEEE Standard for Safety Levels with Respect to Human Exposure to Radio Frequency Electromagnetic Fields,* 3 kHz to 300 GHz," IEEE, New York, N.Y., 1992.) Restrictions on RF exposure that are based directly on established health effects are termed as "Basic Restrictions." ICNIRP and IEEE provide basic restrictions: (a) on induced current density (J) averaged over 1-cm² cross-sectional area of the central nervous system or induced electric field (E) averaged over a 2 mm×2 mm×2 mm tissue volume or induced electric field (E) averaged over a 5-mm length of tissue to prevent nerve stimulation for frequencies <10 MHz, (b) on specific absorption rate (SAR) averaged over 1 g or 10 g of the tissue volume to prevent tissue heating for frequencies between 100 kHz and 10 GHz, and (c) on power density to prevent heating in tissue at or near the body surface for above 10 GHz. Certain embodiments described herein can include averaging of the exposure metrics (e.g., as described in the ICNIRP or IEEE exposure guidelines), but the embodiments described herein are not limited to: averaging the exposure metrics for E, J, SAR, or power density; averaging of the exposure metrics for E, J, SAR, or power density over any particular line, area, or volume of human tissue; or averaging as described in any particular exposure guideline or regulatory standard.

TABLE 1

RF exposure limits for general population for
the frequency range from 1 Hz to 10 MHz:
RF Exposure Limits for General Population (1 Hz to 10 MHz)

| Standard | 1 Hz-10 MHz | | 100 kHz-10 MHz | | |
|---|---|---|---|---|---|
| | Induced E (V/m) ($2 \times 2 \times 2$ mm³ - avg) (CNS & PNS) | Induced J (mA/m²) (1 cm² - avg) (Head/Trunk) | SAR (W/kg) (whole body average) | SAR (W/kg) (Head/Trunk) | SAR (W/kg) (Limbs) |
| ICNIRP 1998 | — | f/500 (f in Hz) | 0.08 | 2 (10-g) | 4 (10-g) |
| ICNIRP 2010 | $1.35 \times 10^{-4}$ f (f in Hz) | — | 0.08 | 2 (10-g) | 4 (10-g) |
| FCC | — | — | 0.08 | 1.6 (1-g) | 4 (10-g) |

Since it is difficult to assess induced fields inside the human body, ICNIRP provides "Reference Levels" in terms of incident electric and magnetic fields for practical exposure assessment in order to determine whether the basic restrictions are likely to be exceeded. These reference levels were derived from the basic restrictions under the worst case coupling condition of a homogenous human body model exposed to uniform incident fields. Similar to the reference levels, IEEE provides Maximum Permissible Exposure (MPE) levels in terms of external electric and magnetic fields, contact currents and power density, for convenience in exposure assessment to ensure that basic restrictions are met.

The reference levels do not specifically address localized exposures; they were determined to represent the incident field levels that are spatially averaged over the entire body of an exposed individual. Moreover, they were determined using homogeneous models and therefore would not provide an accurate estimate for highly inhomogeneous anatomical human models. Hence, the reference levels do not apply well for high-gradient fields that occur in the vicinity of WEVC systems. Even if the reference levels are exceeded, it does not necessarily follow that the basic restrictions have been exceeded, but a more detailed analysis can be helpful to assess the compliance with the basic restrictions.

Figure 9:
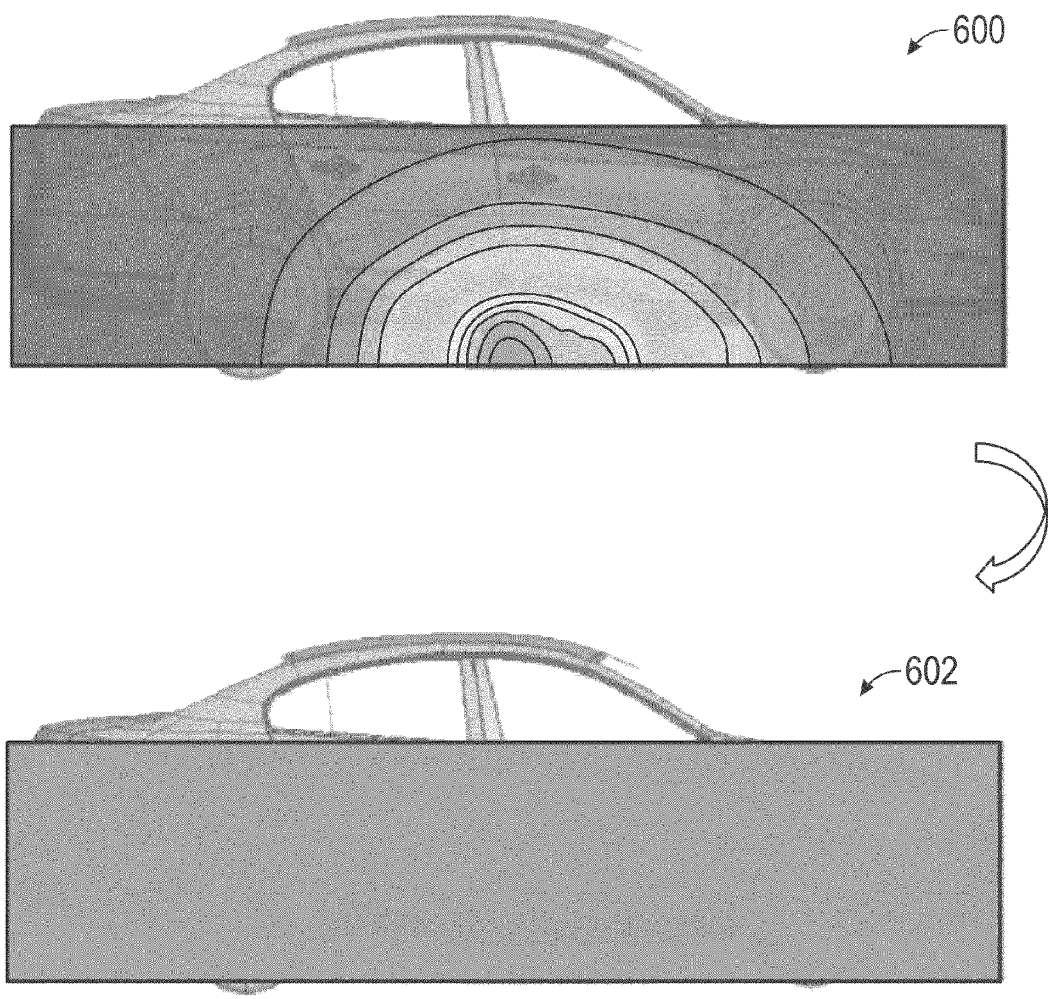
FIG. 9 illustrates exposure levels as compared to reference levels derived based on the assumption that incident fields have uniform distribution with intensity equal to the peak field strength.

Due to the presence of high gradient fields in the vicinity of WEVC systems, the reference levels are typically exceeded at the peak location of the fields. Applying the reference levels for compliance would then imply that the field strength at all locations is equal to the peak value, which will obviously result in an overly conservative assessment. For example, as shown in FIG. 9, reference levels can overestimate exposure as they are derived based on the assumption that incident fields have uniform distribution with intensity equal to the peak field strength. The top portion of FIG. 9 schematically illustrates an example of the intensity of electromagnetic fields 600 physically produced by coils 104, 116 beneath an electric vehicle 112, with the greatest intensity value occurring beneath the electric vehicle 112 in proximity to the coils 104, 116 and reducing intensity at positions farther away from the coils 104, 116.

The bottom portion of FIG. 9 schematically illustrates an example of the intensity of electromagnetic fields 602 based on an assumption that the electromagnetic fields have a uniform intensity distribution with an intensity value equal to the greatest intensity value produced by the coils 104, 116. As can be seen from FIG. 9, the electromagnetic fields 602 resulting from such an assumption clearly overestimates the electromagnetic field strengths and exposures as compared to the physical electromagnetic fields 600. Therefore, a more comprehensive assessment of basic restrictions is desired for the WEVC application.

RF Exposure Assessment

Method of Moments (MoM), Finite-Element Method (FEM), Finite Difference Time Difference (FDTD) and Integral Equation (IE) methods are the most popular methods employed for numerical electromagnetic simulations. Each method has its own advantages and disadvantages, and is not suitable for all electromagnetic problems. Therefore, over the years, many variants of FDTD and FEM methods were developed in the literature by trading off some of the advantages to make them more suitable for specific applications.

The FDTD method is particularly suitable for running electromagnetic simulations involving complex inhomogeneous structures like human anatomical models. (See, e.g., A. Taflove and S. C. Hagness, "*Computational Electromagnetics: The Finite-Difference Time-Domain Method,*" Artech House, Inc., Boston, USA, London, United Kingdom, second edition, 2000.) For example, a "Virtual Family" inhomogeneous anatomical model can be used containing a 34-year-old male model, a 26-year-old female model, a 11-year-old girl model, and a 6-year-old boy model, which can be suitable for such evaluations as they are available at high resolutions (1 mm for body and 0.5 mm for head regions) with more than 80 different tissues and organs of the human body. (See, e.g., A. Christ, W. Kainz, E. G. Hahn, K. Honegger, M. Zefferer, E. Neufeld, W. Rascher, R. Janka, W. Bautz, J. Chen, B. Kiefer, P. Schmitt, H. P. Hollenbach, J. Shen, M. Oberle, D. Szczerba, A. Kam, J. W. Guag and N. Kuster, "*The Virtual Family-Development of surface-based anatomical models of two adults and two children for dosimetric simulations,*" Physics in Medicine and Biology, 55(2):N23-N38, 2010. However, at low frequencies (~100 kHz), voxels of discretized human body model (within few mm) are extremely small compared to the wavelength, which in turn determines the minimum time step based on the Courant-Frederick-Lewy stability criteria. Therefore, FDTD simulations at low frequencies utilize thousands (ratio of time period to minimum time step) of iterations resulting in extremely long times for the simulations to converge. (See, e.g., R. Courant, K. Friedrichs and H. Lewy, "*Über die partiellen Differenzengleichungen der mathematischen Physik,*" Mathematische Annalen, 100 (1): 32-74, 1928.)

The FEM method on the other hand has a limitation in running complex inhomogeneous structures like anatomical human models. However, since it is a frequency domain-based simulation solver, the FEM method is suitable for low frequency exposure assessment albeit using homogeneous phantom models or simplified human models containing few layers such as skin, fat, bone and muscle.

Therefore, it is desirable to employ a hybrid approach to assess the induced fields inside humans from WEVC systems. A work around for the low frequency limitation in FDTD can be to employ frequency scaling. (See, e.g., IEEE Std. C95.3.1:2010, "*IEEE Recommended Practice for Measurements and Computations of Electric, Magnetic, and Electromagnetic Fields with Respect to Human Exposure to Such Fields,* 0 Hz to 100 kHz," IEEE, New York, N.Y., USA, 2010; J. F. Deford and O. P. Gandhi, "*An impedance method to calculate currents induced in biological bodies exposed to quasi-static electromagnetic fields,*" IEEE Transactions on Electromagnetic Compatibility, 27(3): 168-173, 1985; J. D. Moerloose and M. A. Stuchly, "*Reflection analysis of PML ABC's for low-frequency applications,*" IEEE Microwave and Guided Wave Letters, 6(4):177-179, 1996.) At low frequencies, frequency scaling can be applied if the quasi-static condition ($\omega \epsilon_0 \epsilon_r \ll \sigma$) is satisfied for the dielectric properties of all human tissues. (See, e.g., P. A. Hasgall, E. Neufeld, M. C. Gosselin, A. Klingenboeck and N. Kuster, "*IT'IS Database for thermal and electromagnetic parameters of biological tissues,*" Version 2.2, Jul. 11, 2012, available online at http://www.itis.ethz.ch/itis-for-health/tissue-properties/database/.) Alternatively, quasi-static solvers based on Finite Elements can also be used. These methods can be used to develop homogenous models that represent the worst-case exposure in the trunk and the limbs of a human body. Consequently, FEM simulations can be easily performed with such homogeneous models placed near WEVC systems. Minimum separation distance between a WEVC system and the homogeneous models where compliance with the induced field limits is achieved is referred to as the "compliance distance." If humans in typical usage conditions stay away from the WEVC system by more than this distance, then the WEVC system is deemed to be compliant with the RF exposure limits.

The hybrid approaches described above can be used to demonstrate RF exposure assessment in typical usage scenarios with respect to applicable limits. For example, determining induced current density (J) in the Central Nervous System (CNS) and/or induced electric field (E) in bystanders, driver, and passenger(s) while they are in typical usage position(s) relative to a WEVC system (e.g., driver sitting in driver's seat; bystander standing outside front passenger door) can be the first step in demonstrating compliance.

Since humans can be in many different locations and postures inside the electric vehicle as well as outside, it can be impractical to show compliance in all possible locations (e.g., in the driver's seat, in the front passenger seat, in a back seat) and postures (e.g., sitting, standing, lying down, etc.) and anatomical structures (male vs. female, adult vs. child, etc.). Therefore, it is desirable to utilize homogeneous tissue phantoms that represent the worst-case exposure in humans for practical assessment of compliance of WEVC systems with respect to the RF exposure limits.

Homogeneous Tissue Phantom Body and Limb Models

In certain embodiments described herein, comprehensive RF exposure assessment of the induced fields in humans present next to WEVC systems utilize simulation of different human models, various postures and at many separation distances. This simulation would lead to time-consuming approach, even when applying frequency scaling in FDTD or performing quasi-static simulations, if performed using the highly detailed inhomogeneous anatomical structures described above. In certain embodiments described herein, the simulation includes (a) developing homogeneous phantom models (e.g., body and limb phantom models) that represent bulk coupling in anatomical models, and (b) determining worst-case enhancement factors to account for the conservativeness of homogeneous tissue phantoms relative to the localized exposures in inhomogeneous anatomical models.

Figure 10:
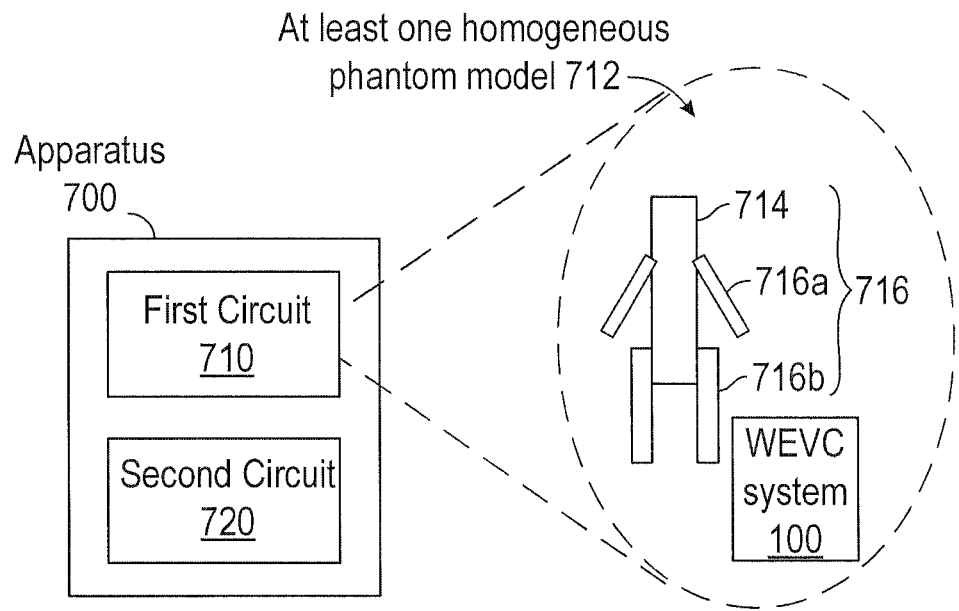
FIG. 10 schematically illustrates an example apparatus for assessing electromagnetic exposure from a WEVC system in accordance with certain embodiments described herein.

FIG. 10 schematically illustrates an example apparatus 700 for assessing electromagnetic exposure from a wireless electric vehicle charging system 100 in accordance with certain embodiments described herein. The apparatus 700 comprises at least a first circuit 710 configured to calculate electromagnetic exposure of at least a portion of at least one human in proximity to the wireless electric vehicle charging system 100. The portion of the at least one human is modeled by at least one homogeneous phantom model 712 (e.g., a homogeneous body phantom model 714 representing a body of the at least one human and a plurality of limb phantom models 716 representing limbs of the at least one human). The at least one homogeneous phantom model 712 has dielectric properties that are representative of human tissue. The apparatus 700 further comprises at least a second circuit 720 configured to scale the calculated electromagnetic exposure to simulate an electromagnetic exposure based on an inhomogeneous anatomical model of the portion of the at least one human.

As used herein, the phrase "inhomogeneous anatomical model" has its broadest reasonable interpretation, including a model that is designed to reflect actual tissue and dielectric properties (e.g., electrical conductivity) of the various portions of a human body and the variations of these tissue and dielectric properties for different portions of the human body. As used herein, the phrase "homogeneous phantom model" has its broadest reasonable interpretation, including a model that is generally uniform with no variations of tissue or dielectric properties across the portion of the human body which it is being used to model. A homogeneous phantom model can be designed to reflect the tissue and dielectric properties of the most common type of tissue being modeled, the tissue and dielectric properties of the tissue having a high electrical conductivity, or a combination of both. For example, while spinal fluid has the highest electrical conductivity and muscles have the second highest electrical conductivity, due to the relative scarcity of spinal fluid within the body and the relative abundance of muscle within the human body, the homogeneous phantom model can be designed to reflect the tissue and dielectric properties of muscle.

Various examples of the wireless electric vehicle charging system 100 are described herein. In certain embodiments, the wireless electric vehicle charging system 100 can comprise at least one base wireless charging system 102 having at least one base system induction coil 104 and at least one vehicle wireless charging system 114 of an electric vehicle 112, the at least one vehicle wireless charging system 114 comprising at least one electric vehicle induction coil 116 (see, e.g., FIG. 8).

In certain embodiments, the apparatus 700 for assessing electromagnetic exposure comprises a specifically-programmed computer which can take a wide variety of forms, including network servers, workstations, personal computers, mainframe computers and the like. The code which configures the computer to perform such analyses is typically proved to the user on a computer-readable medium, such as a CD-ROM. The code may also be downloaded by a user from a network server which is part of a local-area network (LAN) or a wide-area network (WAN), such as the Internet. The computer running the software can include one or more input devices, such as a mouse, trackball, touchpad, and/or keyboard, a display, and computer-readable memory media, such as random-access memory (RAM) integrated circuits and a hard-disk drive. One or more portions, or all of the code may be remote from the user and, for example, resident on a network resource, such as a LAN server, Internet server, network storage device, etc. The apparatus 700 can receive as an input a variety of information concerning the wireless electric vehicle charging system 100 (e.g., structural information, dimensions, operating parameters, electromagnetic intensity distributions) and concerning the human to be modeled (e.g., dimensions).

In certain embodiments, each of the first circuit 710 and the second circuit 720 circuit may comprise a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. The first circuit 710 and the second circuit 720 can comprise the same processor as one another, or can comprise two or more processors separate from one another.

Figure 11:
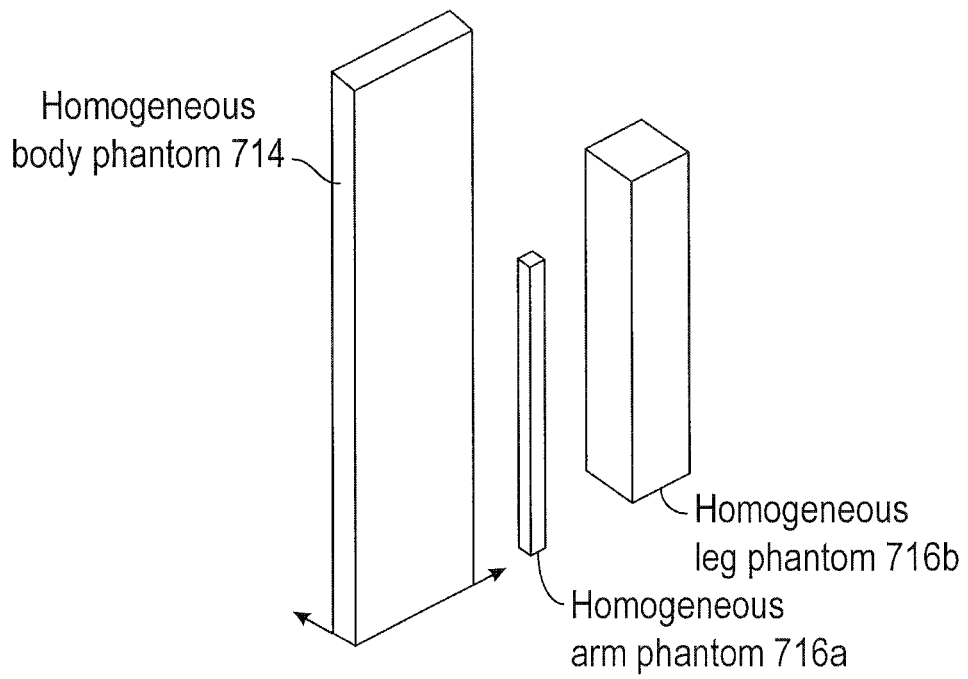
FIG. 11 schematically illustrates example homogeneous phantoms that can be used to represent the human body for compliance assessment in accordance with certain embodiments described herein.

FIG. 11 schematically illustrates example homogeneous phantom models 712 that can be used to represent the human body for compliance assessment in accordance with certain embodiments described herein. For homogeneous body phantom models 714, the Foundation for Research on Information Technologies in Society (IT'IS) has recently developed a homogeneous body phantom 714 to represent the $95^{th}$ percentile specific absorption rate (SAR) of electromagnetic radiation from base station antennas by a trunk portion of a human body in the human population using the statistical data of weight, height and body-mass index of the human population. (See, e.g., C. Gosselin, G. Vermeeren, S. Kuhn, V. Kellerman, S. Benkler, T. Uusitupa, W. Joseph, A. Gati, J. Wiart, F. Meyer, L. Martens, T. Nojima, T. Hikage, Q. Balzano, A. Christ and N. Kuster, "*Estimation formulae for the specific absorption rate in humans exposed to base station antennas*," IEEE Transactions on Electromagnetic Compatibility, 53 (4):909-922, 2011; Diverse Populations Collaborative Group, "*Weight-height relationships and body mass index: Some observations from the diverse populations collaboration*," American Journal of Physical Anthropology, 128(1):220-229, 2005). It was developed for the exposure assessment in the near field of base stations operating between 300 MHz and 5 GHz. For example, an example homogeneous body phantom 714 can have dimensions of 1540 mm in height, 340 mm in width and 90 mm in depth. At low frequencies, this homogeneous body phantom 714 can represent bulk coupling of the electromagnetic exposure observed in a trunk part of the human body. In certain embodiments, the homogeneous phantom model 712 can represent a trunk portion of a body in the human population having a SAR value predetermined using statistical data of weight, height, and body-mass index of the human population. The homogeneous phantom model 712 of certain embodiments can include only the homogeneous body phantom model 714 (e.g., not separately representing the limbs of the human body). In certain other embodiments, the homogeneous phantom model 712 includes one or more limb phantom models 716 to separately represent a corresponding one or more limbs of the human body.

Homogeneous limb phantom models (e.g., examples of a homogeneous arm phantom model 716a and a homogeneous leg phantom model 716b) compatible with certain embodiments described herein are shown in FIG. 11. (See, e.g., J. W. Jürgens, "*Erhebung anthropometrischer Maße zur Aktualisierung der DIN* 33 402—*Teil* 2 (*Survey of anthropomet-*

*ric dimensions for the revision of DIN 33 402—Part 2),*" Bundesanstalt für Arbeitsschutz und Arbeitsmedizin, Technical report, Schriftenreihe der Bundesanstalt für Arbeitsschutz und Arbeitsmedizin, (Monograph issued by the Federal Office for Occupational Safety, 2004.) For example, an example homogeneous arm phantom model 716a can be 810 mm in length having square cross-section of 48 mm width. Similarly, the homogeneous leg phantom model 716b can be 910 mm in length having square cross-section of 170 mm width. In certain embodiments, the homogeneous limb phantom models 716 can represent limbs of the body in the human population having dimensions predetermined using statistical data of weight, height, and body-mass index of the human population.

In certain embodiments, the dielectric properties of the at least one homogeneous body phantom model 714 and the plurality of homogeneous limb phantom models 716 are chosen such that (a) they are representative of human tissue and (b) they do not underestimate the exposure levels in humans. Traditionally, muscle tissue has been used to represent the body. (See, e.g., Federal Communications Commission, Office of Engineering Technology, Supplement C (Ed. 01-01) to OET Bulletin 65 (Ed. 97-01), *"Evaluating Compliance with FCC Guidelines for Human Exposure to Radiofrequency Electromagnetic Fields, Additional Information for Evaluating Compliance of Mobile and Portable Devices with FCC Limits for Human Exposure to Radiofrequency Emissions,"* FCC, Washington, D.C., June, 2001.) In certain embodiments, the at least one homogenous body phantom model 714 and the plurality of homogeneous limb phantom models 716 are defined to have muscle tissue properties with adequate cross-sections to simulate the worst-case bulk coupling of electromagnetic exposure for the human body. Similarly, in certain embodiments, the at least one homogeneous body phantom model 714 can comprise an SAM phantom with brain tissue (e.g., grey matter) properties and can be used for assessing the induced current density in the Central Nervous System (CNS), as required by ICNIRP 1998. (See, e.g., ICNIRP, *"Response to questions and comments on guidelines for limiting exposure to time-varying electric, magnetic and electromagnetic fields* (up to 300 GHz),*"* Health Physics, 75(4):438-439, 1998.

In certain embodiments, a worst-case enhancement factor is selected such that, when performing an electromagnetic exposure calculation using the at least one homogeneous phantom model 712, the scaled electromagnetic exposure in the at least one homogeneous phantom model 712 simulates an electromagnetic exposure calculated using an inhomogeneous anatomical model but is conservative relative to the electromagnetic exposure of the inhomogeneous anatomical model. The enhancement factor can be defined as a peak exposure metric (e.g., peak induced current within the portion of the at least one human; peak electric field within the portion of the at least one human; a peak 1 g-averaged specific absorption rate (SAR) within the portion of the at least one human; a peak 10 g-averaged SAR within the portion of the at least one human; a peak whole-body-averaged SAR within the portion of the at least one human) of the simulated electromagnetic exposure calculated using the inhomogeneous anatomical model divided by the peak exposure metric of the electromagnetic exposure calculated using the at least one homogeneous phantom model 712. For example, the worst-case enhancement factor can be selected such that the peak exposure metric of the scaled electromagnetic exposure simulates, and is not less than, the peak exposure metric of the electromagnetic exposure calculated using the inhomogeneous anatomical model of the at least one human. In determining the worst-case enhancement factor (e.g., the highest enhancement factor such that the scaled exposure simulates but does not exceed the exposure calculated using the inhomogeneous anatomical model), different regions of the inhomogeneous anatomical model can be exposed (e.g., see FIG. 12). The worst-case enhancement factor can be different for different exposure metrics (e.g., electric field E, current J, SAR1 g, SAR10 g). Once the worst-case enhancement factor is determined, it can be used to scale the exposure calculation using the at least one homogeneous phantom model 712 such that the scaled exposure is higher than the exposure calculated using the inhomogeneous anatomical model, thereby providing a conservative estimate. In certain embodiments, the at least one enhancement factor can be selected such that a ratio of the peak exposure metric of the scaled electromagnetic exposure divided by the peak exposure metric of the electromagnetic exposure calculated using the inhomogeneous anatomical model of the at least one human is between one and 1.2, between one and 1.15, between one and 1.10, or between one and 1.05.

Exposure in the at least one homogeneous phantom model 712 (e.g., in the body phantom model 714 and the plurality of homogeneous limb phantom models 716) can advantageously be verified for conservativeness against different anatomical models structures, various orientations of the anatomical models relative to the source, and at different separation distances. See, e.g., IEC Std. 62209-2:2010, *"Human exposure to radio frequency fields from hand-held and body-mounted wireless communication devices-Human models, instrumentation, and procedures—Part 2: Procedure to determine the specific absorption rate (SAR) for wireless communication devices used in close proximity to the human body* (frequency range of 30 MHz to 6 GHz),*"* IEC, Geneva, Switzerland, 2010.

Figure 13:
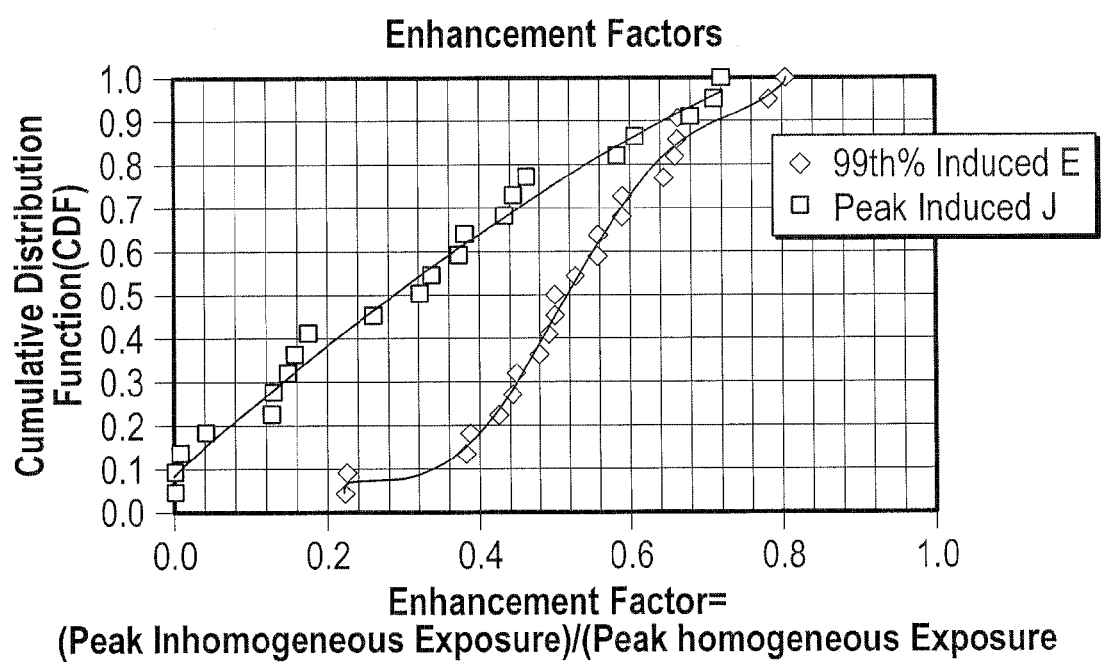
FIG. 13 shows the cumulative distribution function (CDF) plotted versus the enhancement factors for the $99^{th}$ percentile induced electric field (E) and the peak induced current density (J) for a total of 22 simulation cases for the orientations shown in FIG. 12.

Depending on the operating frequency of the electromagnetic fields, the exposure metrics used for compliance evaluation are different. For example, for frequencies less than 100 kHz, induced electric field E and induced current density J can apply. For frequencies between 100 kHz and 10 MHz, induced electric field E, induced current density J, 1 g-averaged SAR, 10 g-averaged SAR, and whole-body-averaged SAR can apply. For frequencies greater than 10 MHz, 1 g-averaged SAR, 10 g-averaged SAR, and whole-body-averaged SAR can apply. Therefore, for WEVC operating at less than 100 kHz, induced electric field E and induced current density J can apply, as shown in FIG. 13. However, the same approach of using at least one homogeneous phantom model and at least one enhancement factor can be also used for other applications, such as wireless charging for portable electronics (e.g., smartphones and tablets) operating between 100 kHz and 10 MHz. For example, such applications can evaluate one or more of: induced electric field E, induced current density J, 1 g-averaged SAR, 10 g-averaged SAR and whole-body-averaged SAR.

The at least one enhancement factor can include enhancement factors for various portions of the human body and for various exposure metrics, such as induced current density J, induced electric field E, 1 g-averaged SAR, 10 g-averaged SAR, and whole-body-averaged SAR. For example, for a specific portion of the human body (e.g., the trunk, the legs, the arms), an enhancement factor can be defined as the ratio of a peak exposure metric (e.g., induced current density J or electric field E) found in the portion of the inhomogeneous anatomical model to that of the corresponding portion of the homogeneous phantom model 712 (e.g., the peak exposure metric of the homogeneous body phantom model 714; the peak exposure metric of the plurality of homogeneous limb phantom models 716). While certain embodiments use the same enhancement factor for both the at least one homogeneous body phantom model 714 and the plurality of homogeneous limb phantom models 716, in certain other embodiments, different enhancement factors can be used for the body and limb phantom models.

The at least one enhancement factor can include enhancement factors for various locations and postures of the human body. For example, for a specific location (e.g., in a specified seat of the electric vehicle 112, alongside the electric vehicle 112 at a specified location) and/or for a specific posture (e.g., standing, sitting, lying down), an enhancement factor can be defined as the ratio of the peak exposure metric calculated from the inhomogeneous anatomical model to that of the corresponding location and posture calculated from the homogeneous phantom model 712.

The at least one enhancement factor can be determined for numerous locations and postures by performing simulations with various inhomogeneous anatomical models and performing simulations with corresponding homogeneous phantom models for the numerous locations and postures relative to an example WEVC system 100. Once determined for the example WEVC system 100, the same at least one enhancement factor can be used for other WEVC systems 100 being evaluated.

Figure 12:
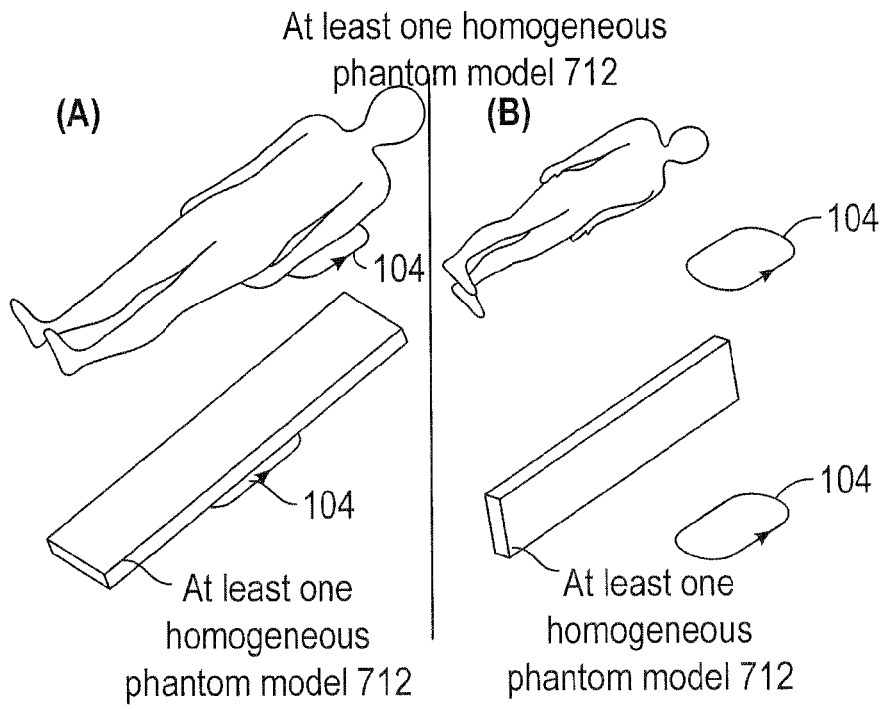
FIG. 12 illustrates simulations of enhancement factors between anatomical models and homogeneous body phantoms in accordance with certain embodiments described herein.

FIG. 12 illustrates simulations of enhancement factors between anatomical models and homogeneous body phantom models determined for (a) coronal orientation on top of the base system induction coil 104 representing humans lying on the WEVC system 100 without the electric vehicle 112, and (b) sagittal orientation representing bystander lying in a sideways posture next to the electric vehicle 112. The simulations were performed on all the anatomical models of the virtual family by placing each of them in coronal orientation (lying posture) on top of the base system induction coil 104 at closer separation distance (e.g., 50 mm), shown in (A) of FIG. 12 and also in sagittal orientation (lying sideways) for bystanders, shown in (B) of FIG. 12 at a typical separation distance (e.g., 500 mm) from the base system induction coil 104. Additionally, the anatomical models were moved along the broader dimension of the base system induction coil 104 in order to expose different regions of the human body, resulting in a total of 22 simulations for all four anatomical models of the virtual family. Standing postures of the virtual family were not simulated for assessing the at least one enhancement factor, as they would result in lower exposure (lower coupled flux) when compared with lying postures shown in FIG. 12.

The homogeneous phantom model 712 with muscle tissue was also simulated in same locations and orientations relative to the base system induction coil 104 as the anatomical models for determining the enhancement factors for $99^{th}$ percentile of induced electric field (as required by ICNIRP 2010), and peak induced current density (J). Subsequently, the cumulative distribution of enhancement factors was plotted in order to determine a worst-case value and also to check if it is desirable to scale exposure values in the homogeneous phantom model 712 for obtaining a conservative exposure assessment. FIG. 13 shows the cumulative distribution function (CDF) plotted versus the enhancement factors for the $99^{th}$ percentile induced electric field (E) and the peak induced current density (J) for a total of 22 simulation cases for the orientations shown in FIG. 12, with each of the diamond plot points representing an enhancement factor obtained from the ratio of the calculated $99^{th}\%$ induced electric field for a specific location, posture, and family member using the anatomical model to that using the homogeneous phantom model 712, and each of the square plot points representing an enhancement factor obtained from the ratio of the calculated peak induced current density for a specific location, posture, and family member using the anatomical model to that using the homogeneous phantom model 712. As can be seen from FIG. 13, the ratios obtained for all locations, postures, and family members and for both the $99^{th}$ percentile value of the induced electric field and the induced current density are less than one, indicating that the electromagnetic exposures calculated using the homogeneous phantom models 712 do provide a conservative estimate of the electromagnetic exposures calculated using the anatomical models. Thus, the homogeneous body phantom model 712 appears to consistently provide overestimates of both the induced electric field and the induced current density as compared to the estimates calculated using the anatomical models. Note that this process, when repeated for other exposure metrics (e.g., 1 g-averaged SAR, 10 g-averaged SAR, and whole-body SAR) can result in a different set of enhancement factors that may or may not be less than one. Additionally, it should be noted that these enhancement factors vary with frequency and can advantageously be determined at the operating frequency of the device under evaluation.

In addition to determining the exposure for the worst-case posture of human anatomical models and at the worst-case orientation relative to the WEVC system 100, further enhancement in exposure can result when a loop is formed with parts of the body, e.g., both hands touch each other or hands touch the body. (See, e.g., J. Nadakuduti, M. Douglas, P. Crespo-Valero and N. Kuster, *"Comparison of different safety standards in terms of human exposure to electric and magnetic fields at* 100 *kHz,"* 33rd Annual Meeting of the Bioelectromagnetics Society (BEMS 2011), Halifax, Canada, Jun. 12-17, 2011.) Body loops couple additional magnetic flux cutting through the airspace enclosed by the loop, and can result in enhanced induced currents/fields that concentrate in narrow cross-section regions of the loop, like finger tips. The additional enhancement resulting from such cases can under-estimate exposure assessment using the homogeneous phantoms.

Figure 14:
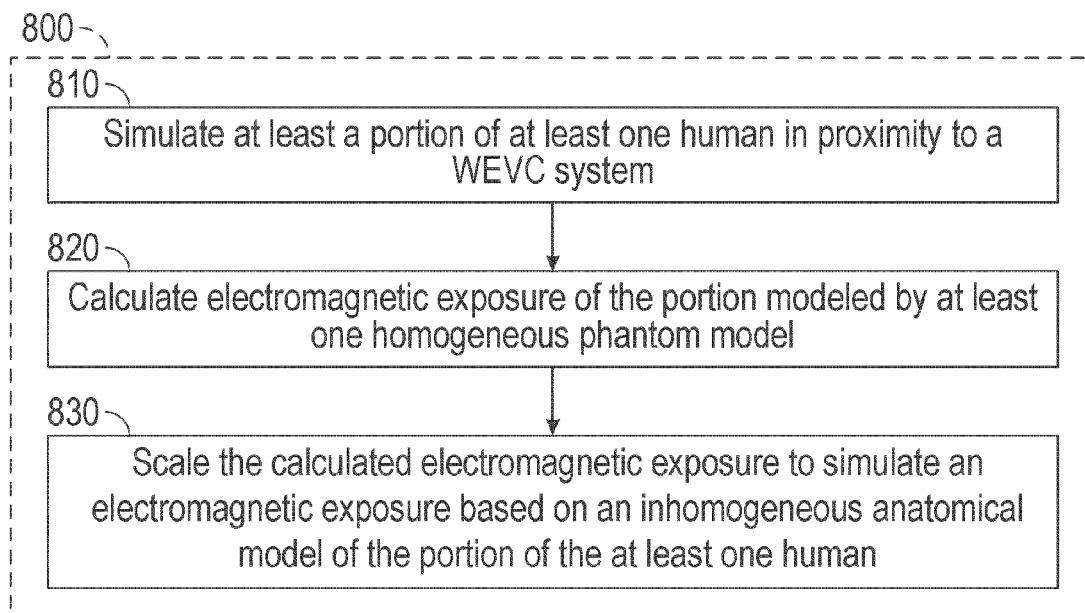
FIG. 14 is a flow diagram of an example method for assessing electromagnetic exposure from a WEVC system in accordance with certain embodiments described herein.

FIG. 14 is a flow diagram of an example method 800 for assessing electromagnetic exposure from a WEVC system 100 in accordance with certain embodiments described herein. In an operational block 810, the method 800 comprises simulating at least a portion of at least one human in proximity to a WEVC system 100. In an operational block 820, the method 800 further comprises calculating electromagnetic exposure of the portion of the at least one human. The portion of the at least one human is modeled by at least one homogeneous phantom model 712 having dielectric properties that are representative of human tissue. In an operational block 830, the method 800 further comprises scaling the calculated electromagnetic exposure to simulate an electromagnetic exposure based on an inhomogeneous anatomical model of the portion of the at least one human. The calculated electromagnetic exposure of the portion of the at least one human modeled by the at least one homogeneous phantom model 712 and the simulated electromagnetic exposure calculated using the inhomogeneous anatomical model of the at least one human are performed under the same exposure condition.

In certain embodiments, simulating the portion of at least one human in proximity to a WEVC system 100 and calculating electromagnetic exposure of the portion of the at least one human can be performed by the first circuit 710 described above. For example, the first circuit 710 can use at least one homogeneous phantom model 712 (e.g., a homogeneous body phantom model 714 and a plurality of homogeneous limb phantom models 716) and can receive information regarding the human to be modeled (e.g., dimensions) to simulate at least the portion of the at least one human. In certain embodiments, the first circuit 710 can calculate the expected electromagnetic intensity distribution from the WEVC system 100 based on information regarding the WEVC system 100 (e.g., structural information, dimensions, operating parameters) received as an input to the first circuit 710 (e.g., from another computer system or from computer storage of the system 700). In certain other embodiments, the first circuit 710 can receive the expected electromagnetic intensity distribution of the WEVC system 100 as an input (e.g., from another computer system or from computer storage of the apparatus 700). The first circuit 710 can use the simulated portion of the at least one human and the expected electromagnetic intensity distribution from the WEVC system 100 to calculate electromagnetic exposure of the portion of the at least one human.

In certain embodiments, scaling the calculated electromagnetic exposure can be performed by the second circuit 720 described above. For example, the second circuit 720 can access the calculated electromagnetic exposure produced by the first circuit 710 and can access at least one enhancement factor that was previously determined (e.g., from stored comparisons of simulations of a human in various locations and postures using inhomogeneous anatomical models and simulations with corresponding homogeneous phantom models for the various locations and postures relative to an example WEVC system). The second circuit 720 can multiply the calculated electromagnetic exposure for the portion of the at least one human from the WEVC system 100 being evaluated by the corresponding at least one enhancement factor to produce a simulation of an electromagnetic exposure calculated using an inhomogeneous anatomical model of the portion of the at least one human.

In order to validate the simulation results and in particular, to verify if the numerical model of the WEVC system 100 used in the simulations is an accurate representation of the physical device, simulated free-space magnetic fields emitted by the WEVC system 100 can be compared with measurements of the emitted fields. Additionally, uncertainty budget analysis can be performed for both simulations and measurements to determine the overall combined uncertainty. If the deviation between the simulated and the measured free-space magnetic fields is within the combined uncertainty, then the simulation model chosen can be determined to be a good representation of the WEVC system 100. Otherwise, the accuracy of the WEVC simulation model can be improved before performing the RF exposure assessment using the numerical simulations (e.g., the homogeneous phantom models).

Figure 15:
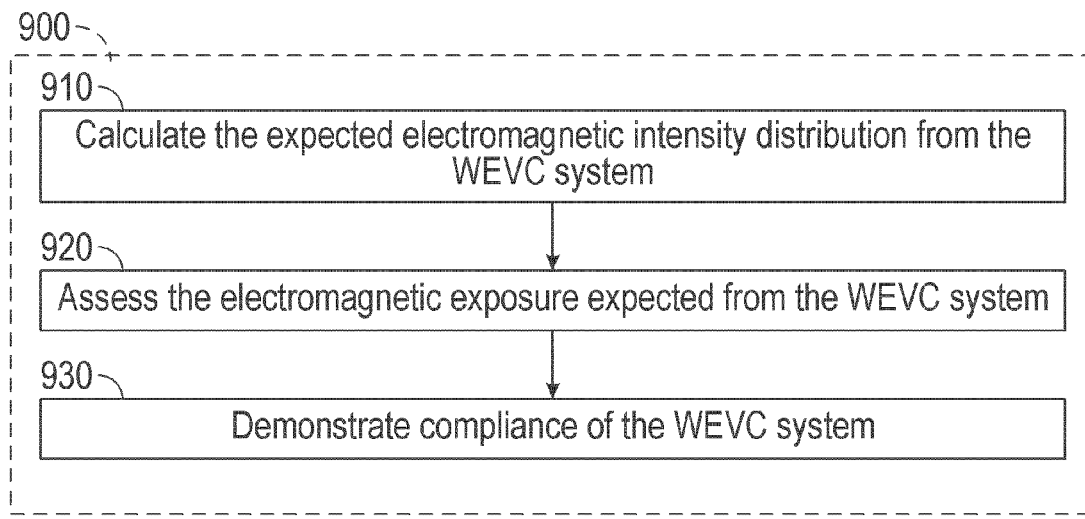
FIG. 15 is a flow diagram of a method for demonstrating compliance with predetermined electromagnetic exposure limitations for a WEVC system in accordance with certain embodiments described herein.

FIG. 15 is a flow diagram of a method 900 for demonstrating compliance with predetermined electromagnetic exposure limitations for a WEVC system 100 in accordance with certain embodiments described herein. In an operational block 910, the method 900 comprises calculating an expected electromagnetic intensity distribution from the WEVC system 100. For example, a numerical electromagnetic simulation can be performed to simulate the free-space field distribution around the WEVC system 100. In an operational block 920, the method 900 can further comprise assessing the electromagnetic exposure expected from the WEVC system 100 (e.g., using the method 800 described above). For example, numerical simulations for various usage scenarios and separation distances can be performed using simplified homogeneous phantom models that represent bulk coupling of the electromagnetic exposure in anatomical models, and the exposure results can be scaled using worst-case enhancement factors in order to obtain conservative exposure assessments in inhomogeneous anatomical human models. In an operational block 930, the method 900 can further comprise demonstrating compliance of the WEVC system 100 using the assessment. For example, demonstrating compliance can comprise determining minimum separation distances of humans with respect to the WEVC system 100 for compliance. Compliance with the exposure limits is ensured if humans in close proximity of the WEVC system 100 are farther than this minimum separation distance in all usage scenarios.

Figure 16:
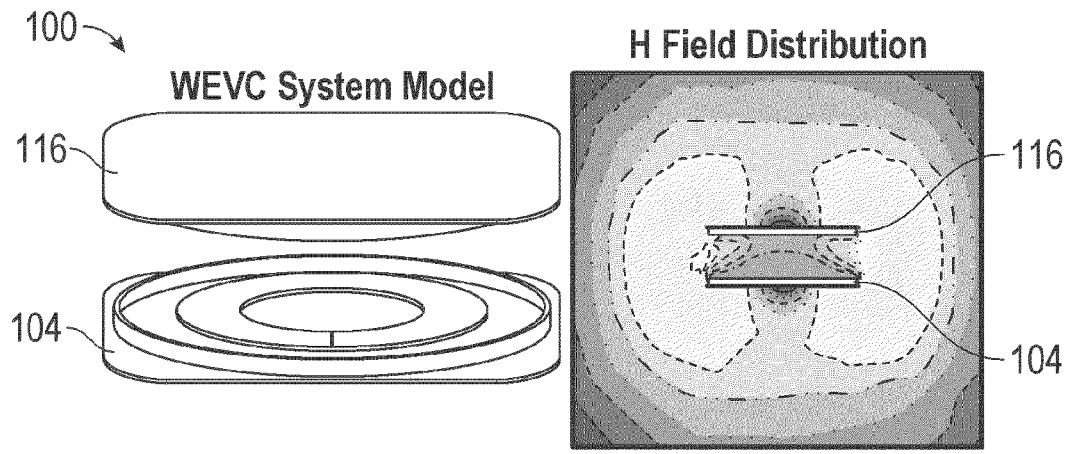
FIG. 16 illustrates a magnetic-field distribution in free space around a simulated WEVC system.
Figure 17:
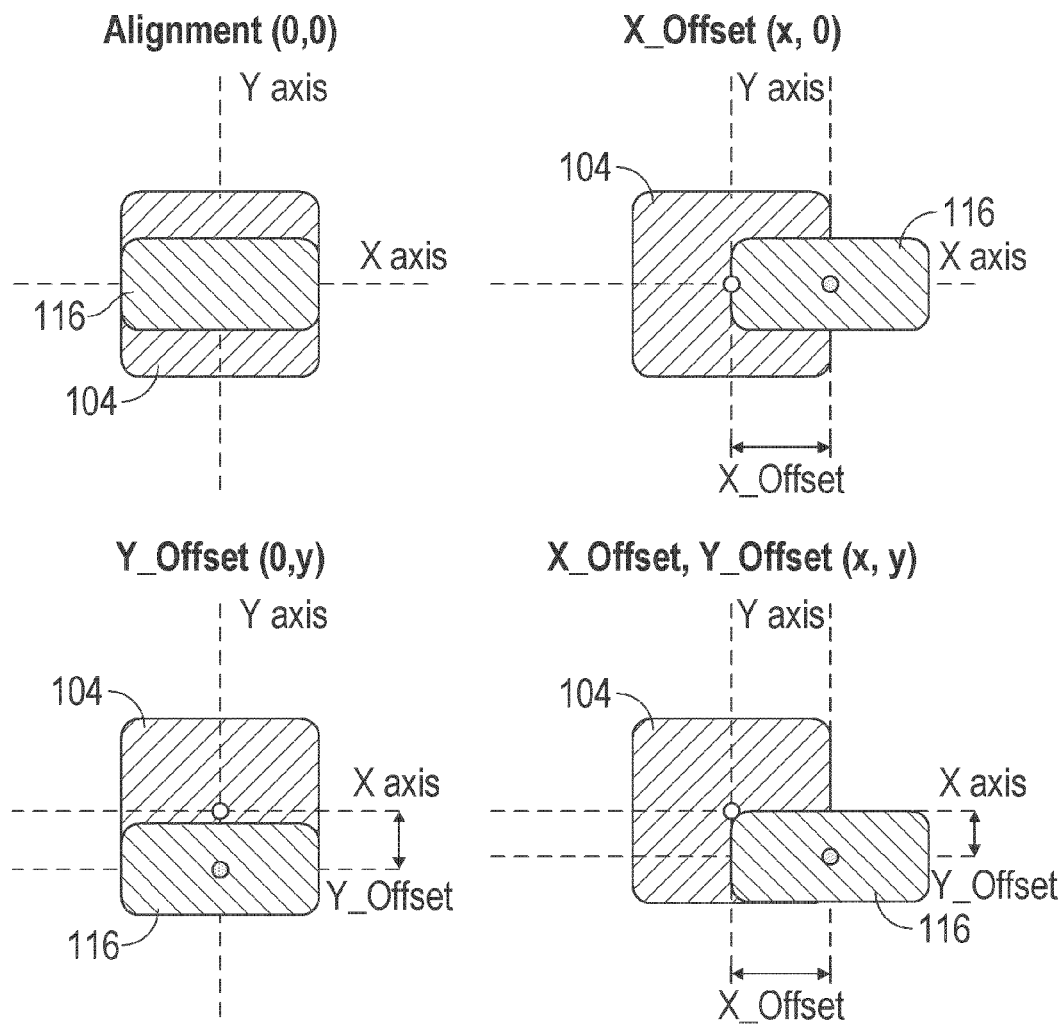
FIG. 17 schematically illustrates offset labeling for various alignments between transmitter and receiver coils.
Figure 18:
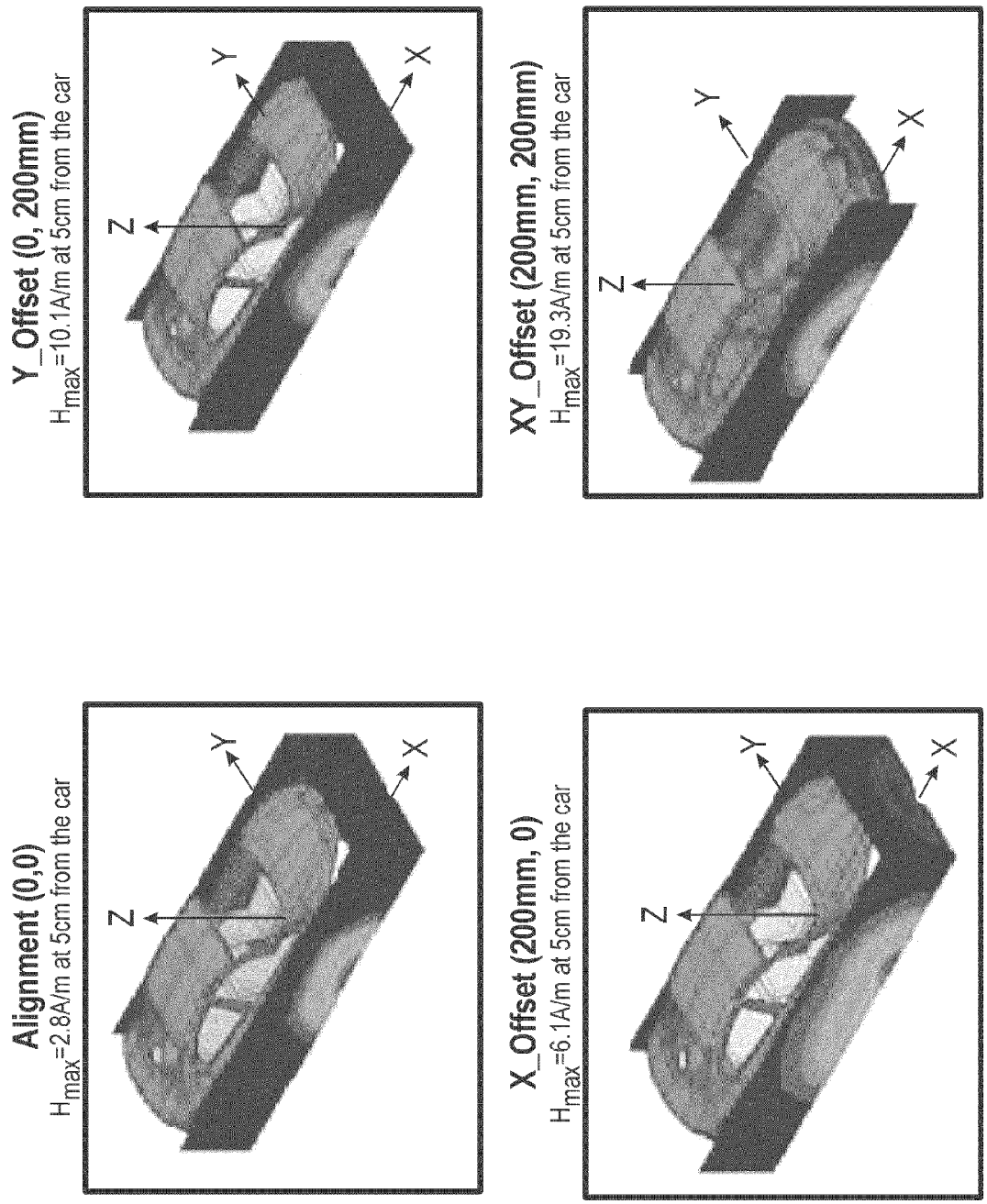
FIG. 18 illustrates the influence of alignment offset between transmitter and receiver coils on emitted magnetic fields around an example 3.3 kW WEVC system.

The following example illustrates a demonstration of compliance of a WEVC system 100 in accordance with certain embodiments described herein. FIG. 16 illustrates a magnetic-field distribution in free space around a simulated WEVC system 100 used to calculate the expected electromagnetic intensity distribution from the WEVC system 100. The model of the wireless power transfer system 100 included the geometry of the coil structures, operating frequency, and maximum operating currents in both the base system induction coil 104 (e.g., transmitter coil) and the electric vehicle induction coil 116 (e.g., receiver coil) along with their relative phase information. In addition, the worst-case for incident fields was determined. Since there are many variables that impact the fields emitted from the WEVC system 100 (e.g., car dimensions, worst-case ground conditions, separation and alignment offset between transmitter and receiver coils, and magnitudes as well as the relative phase difference between the transmitter coil current and the receiver coil current, etc.), their influences can be numerically simulated to determine the worst-case emitted magnetic fields. For example, the emitted electric fields can be extremely localized around the coils and therefore less of a concern in terms of RF exposure, as is presumed in this modeling. FIGS. 17 and 18 show the influence of the offset in the alignment of the base system induction coil 104 (e.g., transmitter coil) and the electric vehicle induction coil 116 (e.g., receiver coil) on the magnetic fields for an example 3.3 kW WEVC system 100.

Figure 19:
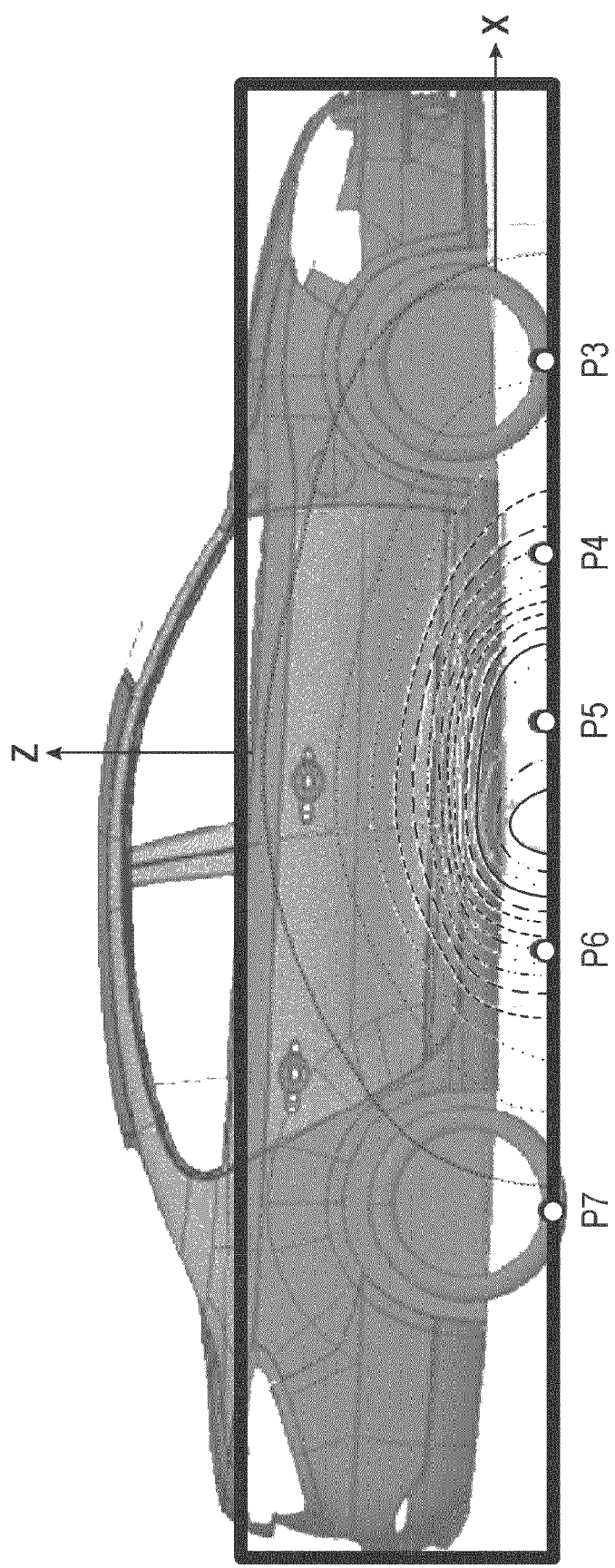
FIG. 19 schematically illustrates positions at which measured and simulated magnetic field emanating from an example WEVC system are compared.

As mentioned above, the free-space magnetic fields can be experimentally validated in order to verify the accuracy of the WEVC simulation model. For example, measurements of the magnetic field values in the presence of an electric vehicle 112 can be compared with the simulated fields for validation of the calculated expected electromagnetic intensity distribution to see if the deviation is less than the combined expanded uncertainty of measurements and simulations. This can be desirable for verifying the accuracy of the WEVC simulation model prior to performing RF exposure assessment. FIG. 19 and Table 2 show an example of good correlation between measured and simulated magnetic field emanating from an example WEVC system 100.

TABLE 2

|  | P3 | P4 | P5 | Worst Pt | P6 | P7 |
|---|---|---|---|---|---|---|
| Measured B (µT) at evenly spaced points | 1.12 | 2.32 | 4.76 | missed | 2.02 | 0.70 |
| Measured B (µT) at the worst location | — | — | — | 5.62 | — | — |
| Simulated B (µT) At rated electrical parameters | 1.34 | 2.62 | 5.62 | 6.48 | 2.60 | 0.91 |
| Under the condition of ±10% operation range | — | — | — | 4.61~7.38 | — | — |

Uncertainty assessment for both measurements and numerical simulations were performed in order to validate the accuracy of WEVC model representation in the simulations. The total uncertainty was calculated by performing the root-mean-square of the various uncertainty sources, assuming that they are independent or have limited interdependencies. Uncertainty assessment for free-space magnetic field measurements involves the determination of uncertainties from probe calibration, probe isotropy, linearity, RF ambient noise, separation distance, source power drift, etc. Numerical simulation uncertainty assessment involves the determination of uncertainties from simulation parameters, convergence, tissue parameters, source modeling, etc. (See, e.g., IEEE Std. 1528.1 D1.0. *"IEEE Draft Standard for Recommended Practice for Determining the Spatial-Peak Specific Absorption Rate (SAR) in the Human Body Due to Wireless Communications Devices,* 30 *MHz-6 GHz: General Requirements for using the Finite Difference Time Domain (FDTD) Method for SAR Calculations,"* IEEE, New York, N.Y., USA.)

Figure 20:
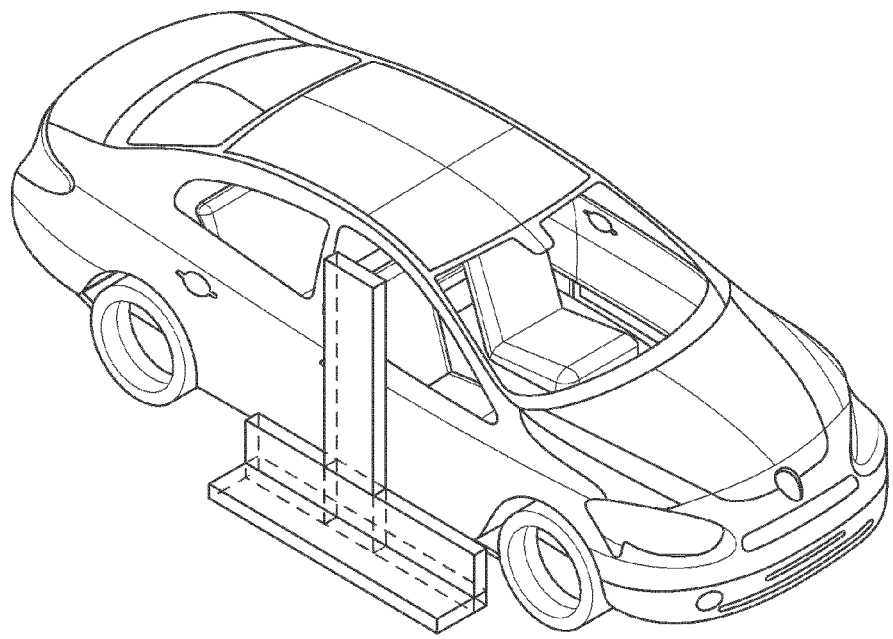
FIG. 20 schematically illustrates various orientations of body phantom for bystander exposure assessment.
Figure 21:
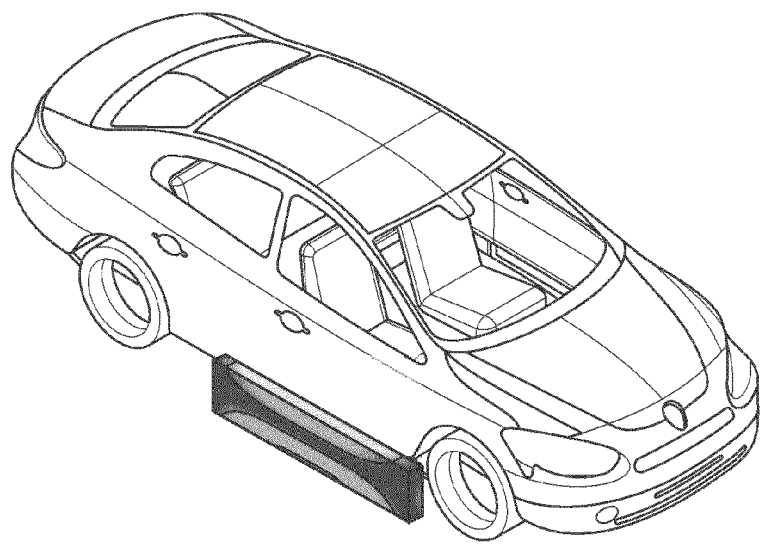
FIG. 21 schematically illustrates induced electric field distribution in the body phantom for the worst-case bystander orientation.

For an estimate of compliance distance, RF exposure was evaluated for various orientations and separation distances using the homogeneous phantom model 712 in order to determine the minimum separation distance(s) that provide compliance with the limits. For WEVC application, if the compliance distance is less than the dimensions of the electric vehicle 112, then the WEVC system 100 can be deemed to be compliant, since bystanders adjacent to the electric vehicle 112 will be inherently at a distance larger than compliance distance. FIG. 20 shows an example of performing the assessment with the homogeneous phantom model 712. The homogeneous phantom model 712 is positioned in the hot spot identified for worst-case magnetic fields and then the exposure is evaluated for various orientations (standing, lying down and lying down sideways). Highest exposures (e.g., internal electric field and induced current density) can be observed when positioning the homogeneous phantom model 712 close to the edge of the electric vehicle 112 and in the orientation shown in FIG. 21 (e.g., lying down sideways).

The enhancement factor was also taken into account to determine the worst-case exposure for a bystander, which was less than ICNIRP's basic restrictions.

In this particular example, the minimum separation distance for compliance was less than the half-width of the electric vehicle 112. Therefore, the WEVC system 100 evaluated is in compliance with ICNIRP basic restrictions for bystanders.

Electromagnetic exposure in humans who are in close proximity of WEVC systems 100 can advantageously benefit from certain embodiments described herein for estimation, due to the lack of standardized procedures for RF exposure assessment at low frequencies (<10 MHz). Certain embodiments described herein can be used to assess induced fields inside humans using a combination of numerical simulations and to provide experimental validation for demonstrating compliance of WEVC systems 100 (e.g., to exposure limits provided by international bodies like ICNIRP).

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the embodiments of the invention.

The various illustrative blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium may reside in an ASIC. The ASIC may reside in a user terminal. In the alternative, the processor and the storage medium may reside as discrete components in a user terminal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for assessing electromagnetic exposure, the apparatus comprising:
    at least a first circuit configured to calculate electromagnetic exposure of at least a portion of at least one human in proximity to a wireless electric vehicle charging system, the portion of the at least one human modeled by at least one homogeneous phantom model having dielectric properties that are representative of human tissue; and
    at least a second circuit configured to scale the calculated electromagnetic exposure to simulate an electromagnetic exposure based on an inhomogeneous anatomical model of the portion of the at least one human.

2. The apparatus of claim 1, wherein the at least one homogeneous phantom model comprises a homogeneous body phantom model representing a body of the at least one human.

3. The apparatus of claim 2, wherein the homogeneous body phantom model represents a trunk portion of the at least one body in the human population having a specific absorption rate value predetermined using statistical data of weight, height, and body-mass index of the human population.

4. The apparatus of claim 2, wherein the at least one homogeneous phantom model further comprises a plurality of limb phantom models representing limbs of the at least one human.

5. The apparatus of claim 4, wherein the plurality of limb phantom models represents limbs of the at least one body in the human population having dimensions predetermined using statistical data of weight, height, and body-mass index of the human population.

6. The apparatus of claim 1, wherein the calculated electromagnetic exposure is scaled using at least one enhancement factor derived from a ratio of a first peak exposure metric of the simulated electromagnetic exposure calculated using the inhomogeneous anatomical model to a second peak exposure metric of the electromagnetic exposure calculated using the at least one homogeneous phantom model.

7. The apparatus of claim 6, wherein the first and second peak exposure metrics are based on a peak induced current within the portion of the at least one human.

8. The apparatus of claim 6, wherein the first and second peak exposure metrics are each selected from a group consisting of: a peak electric field within the portion of the at least one human; a peak 1 g-averaged specific absorption rate (SAR) within the portion of the at least one human; a peak 10 g-averaged SAR within the portion of the at least one human; and a peak whole-body-averaged SAR within the whole of the at least one human.

9. The apparatus of claim 6, wherein the ratio is between one and 1.2.

10. The apparatus of claim 6, wherein the ratio is between one and 1.1.

11. The apparatus of claim 1, wherein the first circuit comprises a processor and the second circuit comprises the processor.

12. An apparatus for assessing electromagnetic exposure, the apparatus comprising:
    simulating means for simulating at least a portion of at least one human in proximity to a wireless electric vehicle charging system;
    calculating means for calculating electromagnetic exposure of the portion of the at least one human, the portion of the at least one human modeled by at least one homogeneous phantom model having dielectric properties that are representative of human tissue; and
    scaling means for scaling the calculated electromagnetic exposure to simulate an electromagnetic exposure based on an inhomogeneous anatomical model of the portion of the at least one human.

13. The apparatus of claim 12, wherein the simulating means comprises at least a first circuit of a processor and the calculating means comprises the first circuit of the processor.

14. The apparatus of claim 13, wherein the enhancing means comprises at least a second circuit of the processor.

15. The apparatus of claim 12, wherein the at least one homogeneous phantom model comprises a homogeneous body phantom model representing a body of the at least one human and a plurality of limb phantom models representing limbs of the at least one human.

16. The apparatus of claim 12, wherein the calculated electromagnetic exposure is scaled using at least one enhancement factor derived from a ratio of a first peak exposure metric of the simulated electromagnetic exposure calculated using the inhomogeneous anatomical model to a second peak exposure metric of the electromagnetic exposure calculated using the at least one homogeneous phantom model.

17. The apparatus of claim 16, wherein the first and second peak exposure metrics are each selected from a group consisting of: a peak induced current within the portion of the at least one human; a peak electric field within the portion of the at least one human; a peak 1 g-averaged specific absorption rate (SAR) within the portion of the at least one human; a peak 10 g-averaged SAR within the portion of the at least one human; and a peak whole-body-averaged SAR within the portion of the at least one human.

18. A method for assessing electromagnetic exposure, the method comprising:

simulating at least a portion of at least one human in proximity to a wireless electric vehicle charging system;

calculating electromagnetic exposure of the portion of the at least one human, the portion of the at least one human modeled by at least one homogeneous phantom model having dielectric properties that are representative of human tissue; and scaling the calculated electromagnetic exposure to simulate an electromagnetic exposure based on an inhomogeneous anatomical model of the portion of the at least one human.

19. The method of claim 18, wherein the at least one homogeneous phantom model comprises a homogeneous body phantom model representing a body of the at least one human.

20. The method of claim 19, wherein the homogeneous body phantom model represents a trunk portion of the at least one body in the human population having a specific absorption rate value predetermined using statistical data of weight, height, and body-mass index of the human population.

21. The method of claim 19, wherein the at least one homogeneous phantom model further comprises a plurality of limb phantom models representing limbs of the at least one human.

22. The method of claim 21, wherein the plurality of limb phantom models represents limbs of the at least one body in the human population having dimensions predetermined using statistical data of weight, height, and body-mass index of the human population.

23. The method of claim 18, wherein the calculated electromagnetic exposure is scaled using at least one enhancement factor derived from a ratio of a first peak exposure metric of the simulated electromagnetic exposure calculated using the inhomogeneous anatomical model to a second peak exposure metric of the electromagnetic exposure calculated using the at least one homogeneous phantom model.

24. The method of claim 23, wherein the first and second peak exposure metrics are based on a peak induced current within the portion of the at least one human.

25. The method of claim 23, wherein the first and second peak exposure metrics are each selected from a group consisting of: a peak electric field within the portion of the at least one human; a peak 1 g-averaged specific absorption rate (SAR) within the portion of the at least one human; a peak 10 g-averaged SAR within the portion of the at least one human; and a peak whole-body-averaged SAR within the portion of the at least one human.

26. The method of claim 23, wherein the ratio is between one and 1.2.

27. The method of claim 23, wherein the ratio is between one and 1.1.

28. A method for demonstrating compliance with predetermined electromagnetic exposure limitations, the method comprising:

calculating an expected electromagnetic intensity distribution from a wireless electric vehicle charging system;

assessing the electromagnetic exposure expected from the wireless electric vehicle charging system using the method of claim 18 to produce an assessment; and demonstrating compliance using the assessment.

29. A non-transitory computer-readable medium for assessing electromagnetic exposure, the medium having encoded thereon instructions that when executed by a computer cause the computer to:

simulate at least a portion of at least one human in proximity to a wireless electric vehicle charging system;

calculate electromagnetic exposure of the portion of the at least one human, the portion of the at least one human modeled by at least one homogeneous phantom model having dielectric properties that are representative of human tissue; and scale the calculated electromagnetic exposure to simulate an electromagnetic exposure based on an inhomogeneous anatomical model of the portion of the at least one human.

\* \* \* \* \*